US012757574B2

(12) United States Patent
Kim et al.

(10) Patent No.: US 12,757,574 B2
(45) Date of Patent: Oct. 6, 2026

(54) DISPLAY APPARATUS

(71) Applicant: Samsung Display Co., Ltd., Yongin-Si (KR)

(72) Inventors: Yeonhong Kim, Yongin-si (KR); Jongbeom Ko, Yongin-si (KR); Eunhyun Kim, Yongin-si (KR); Yeonkeon Moon, Yongin-si (KR); Sunhee Lee, Yongin-si (KR); Junghoon Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 313 days.

(21) Appl. No.: 18/373,094

(22) Filed: Sep. 26, 2023

(65) Prior Publication Data

US 2024/0260315 A1 Aug. 1, 2024

(30) Foreign Application Priority Data

Jan. 30, 2023 (KR) ........................ 10-2023-0011864

(51) Int. Cl.
*H10K 59/121* (2023.01)
*H10K 59/12* (2023.01)

(52) U.S. Cl.
CPC ..... *H10K 59/1213* (2023.02); *H10K 59/1201* (2023.02)

(58) Field of Classification Search
CPC .... H10D 86/421; H10D 86/60; H10K 59/131; H10K 59/805
See application file for complete search history.

(56) References Cited

U.S. PATENT DOCUMENTS

| | | | | |
|---|---|---|---|---|
| 11,107,844 | B2 | 8/2021 | Je et al. | |
| 2021/0359066 | A1* | 11/2021 | An | H10D 30/6755 |
| 2022/0149132 | A1 | 5/2022 | Moon et al. | |
| 2022/0302233 | A1 | 9/2022 | Liu et al. | |
| 2022/0399420 | A1* | 12/2022 | Chu | H10K 59/1216 |

FOREIGN PATENT DOCUMENTS

| | | | |
|---|---|---|---|
| KR | 10-2016-0001851 | A | 1/2016 |
| KR | 10-2018-0079082 | A | 7/2018 |
| KR | 10-2019-0076220 | A | 7/2019 |
| KR | 10-2022-0064481 | A | 5/2022 |

* cited by examiner

*Primary Examiner* — Alexander G Ghyka
(74) *Attorney, Agent, or Firm* — Innovation Counsel LLP

(57) ABSTRACT

A display apparatus includes a substrate including a display area and a peripheral area outside the display area, a pixel circuit disposed in the display area and including a driving thin-film transistor and a switching thin-film transistor, wherein the driving thin-film transistor includes a driving semiconductor layer, and the switching thin-film transistor includes a switching semiconductor layer, a display element connected to the pixel circuit, and a built-in driving circuit portion disposed in the peripheral area and including a first peripheral thin-film transistor including a first peripheral semiconductor layer, wherein the driving semiconductor layer and the switching semiconductor layer include a same material and each have a mobility less than a mobility of the first peripheral semiconductor layer.

9 Claims, 38 Drawing Sheets

DISPLAY APPARATUS

CROSS-REFERENCE TO RELATED APPLICATION

This application is based on and claims priority under 35 U.S.C. § 119 to Korean Patent Application No. 10-2023-0011864, filed on Jan. 30, 2023, in the Korean Intellectual Property Office, the disclosure of which is incorporated by reference herein in its entirety.

BACKGROUND

1. Field

One or more embodiments relate to an apparatus, and more particularly, to a display apparatus.

2. Description of the Related Art

Mobile electronic apparatuses are widely used. Recently, mobile electronic apparatuses such as tablet personal computers (PCs) and miniaturized electronic apparatuses such as mobile phones have been widely used.

To support various functions, for example, a function to provide a user with visual information, such as images, the mobile electronic apparatuses include a display apparatus. Recently, as the parts configured to drive a display apparatus have been miniaturized, the proportion of the display apparatus in an electronic apparatus has gradually increased and a structure that may be bent to form a preset angle with respect to a flat state is also under development.

SUMMARY

One or more embodiments include a display apparatus with a reduced number of contact holes, wherein semiconductor layers disposed in a pixel circuit include the same material, and the contact holes connect a driving semiconductor layer and a switching semiconductor layer to each other.

One or more embodiments include a display apparatus, wherein a driving semiconductor layer and a switching semiconductor layer include a relatively low mobility.

One or more embodiments include a display apparatus with a relatively reduced distance between a semiconductor layer and a gate electrode disposed in a pixel circuit.

However, such a technical problem is just an example, and the disclosure is not limited thereto.

Additional aspects will be set forth in part in the description which follows and, in part, will be apparent from the description, or may be learned by practice of the presented embodiments of the disclosure.

According to one or more embodiments, a display apparatus includes a substrate, a pixel circuit, a display element, and a built-in driving circuit portion. The substrate includes a display area and a peripheral area outside the display area. The pixel circuit is disposed in the display area and includes a driving thin-film transistor and a switching thin-film transistor, wherein the driving thin-film transistor includes a driving semiconductor layer, and the switching thin-film transistor includes a switching semiconductor layer. The display element is connected to the pixel circuit. The built-in driving circuit portion is disposed in the peripheral area and includes a first peripheral thin-film transistor including a first peripheral semiconductor layer. The driving semiconductor layer and the switching semiconductor layer include a same material and each have a mobility less than a mobility of the first peripheral semiconductor layer.

The driving semiconductor layer and the switching semiconductor layer may each be thicker than the first peripheral semiconductor layer.

A thickness of the driving semiconductor layer and a thickness of the switching semiconductor layer may be the same.

The display apparatus may further include a first gate insulating layer disposed under the driving semiconductor layer and the switching semiconductor layer and disposed on the first peripheral semiconductor layer.

The display apparatus may further include a second gate insulating layer disposed on the driving semiconductor layer and the switching semiconductor layer in the display area and disposed on the first gate insulating layer in the peripheral area.

The built-in driving circuit portion may include a second peripheral thin-film transistor including a second peripheral semiconductor layer, and the second peripheral semiconductor layer may include a same material as a material of the driving semiconductor layer and the switching semiconductor layer.

A thickness of the second peripheral semiconductor layer may be the same as a thickness of the driving semiconductor layer and the switching semiconductor layer.

Each of the driving semiconductor layer and the switching semiconductor layer may include indium-gallium-zinc-oxide (InGaZn).

The first peripheral semiconductor layer may include indium-tin-gallium-zinc-oxide (InSnGaZnO).

The display apparatus may further include a bias electrode disposed on the substrate to correspond to the driving thin-film transistor.

According to one or more embodiments, a display apparatus includes a substrate, a pixel circuit, and a built-in driving circuit portion. The substrate includes a display area and a peripheral area outside the display area. The pixel circuit is disposed in the display area. The display element is connected to the pixel circuit. The built-in driving circuit portion is disposed in the peripheral area and including a first peripheral thin-film transistor and a second peripheral thin-film transistor. The first peripheral thin-film transistor includes a first peripheral semiconductor layer, and the second peripheral thin-film transistor includes a second peripheral semiconductor layer, wherein the first peripheral semiconductor layer has a mobility greater than a mobility of the second peripheral semiconductor layer.

The second peripheral semiconductor layer may be thicker than the first peripheral semiconductor layer.

The display apparatus may further include a first gate insulating layer disposed on the first peripheral semiconductor layer and disposed under the second peripheral semiconductor layer.

The display apparatus may further include a second gate insulating layer disposed on the second peripheral semiconductor layer, wherein the second gate insulating layer may be disposed on the first gate insulating layer on the first peripheral semiconductor layer.

The pixel circuit may include a driving thin-film transistor including a driving semiconductor layer, and a switching thin-film transistor including a switching semiconductor layer, wherein each of the driving semiconductor layer and the switching semiconductor layer includes a same material as a material of the second peripheral semiconductor layer and has a mobility less than a mobility of the first peripheral semiconductor layer.

A thickness of the driving semiconductor layer and a thickness of the switching semiconductor layer may be the same.

A thickness of the second peripheral semiconductor layer may be the same as a thickness of the driving semiconductor layer and the switching semiconductor layer.

The display apparatus may further include a bias electrode disposed on the substrate to correspond to the driving thin-film transistor.

The first peripheral semiconductor layer may include indium-tin-gallium-zinc-oxide (InSnGaZnO).

The second peripheral semiconductor layer may include indium-gallium-zinc-oxide (InGaZnO).

These and/or other aspects will become apparent and more readily appreciated from the following detailed description of the embodiments, the accompanying drawings, and claims.

BRIEF DESCRIPTION OF THE DRAWINGS

The above and other aspects and features of certain embodiments of the disclosure will be more apparent from the following description taken in conjunction with the accompanying drawings.

DETAILED DESCRIPTION

Figure 1:
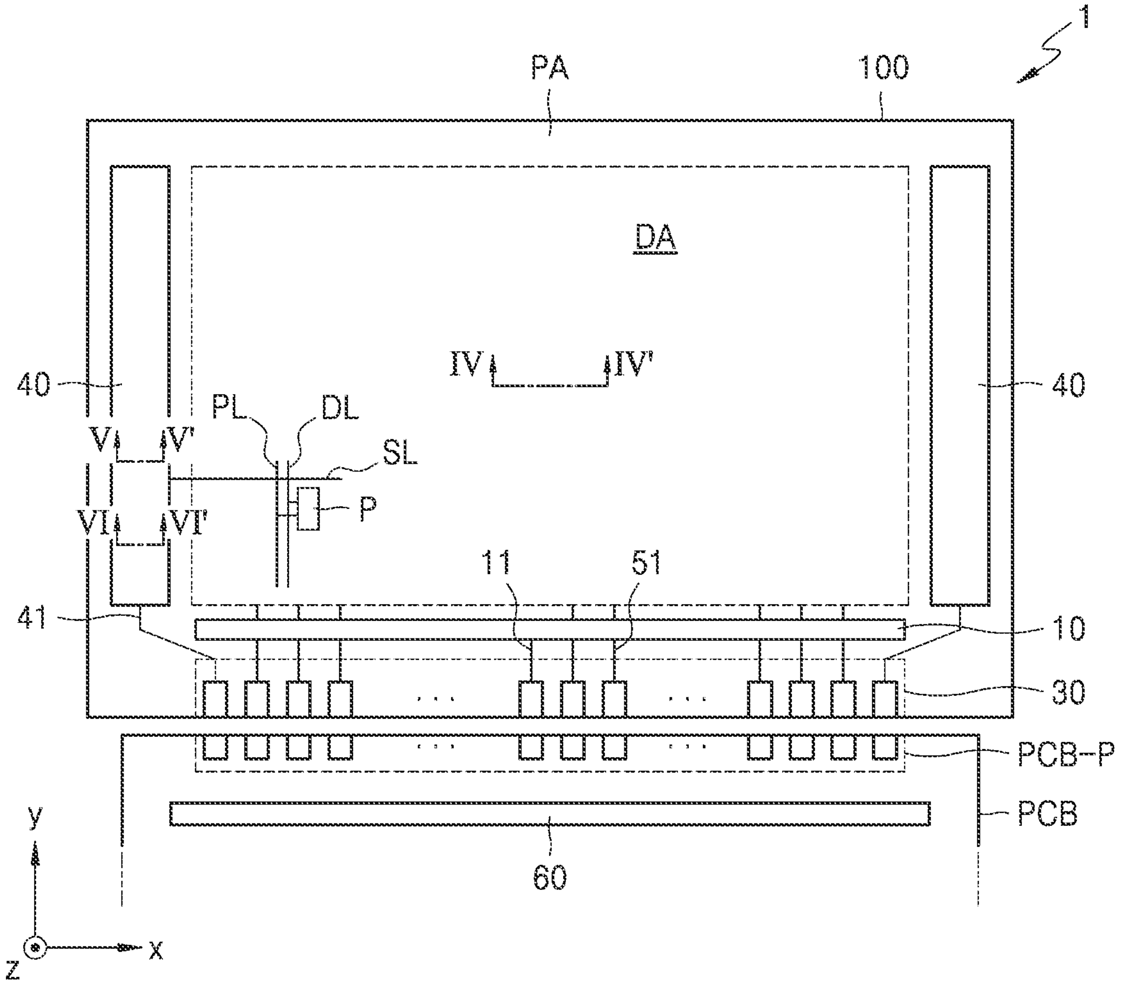
FIG. 1 is a schematic plan view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, wherein like reference numerals refer to like elements throughout and a repeated description thereof is omitted.

While such terms as "first" and "second" may be used to describe various elements, such elements must not be limited to the above terms. The above terms are used to distinguish one element from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or elements but do not preclude the addition of one or more other features or elements.

It will be further understood that, when a layer, region, or element is referred to as being "on" another layer, region, or element, it can be directly or indirectly on the other layer, region, or element. That is, for example, intervening layers, regions, or elements may be present.

Sizes of elements in the drawings may be exaggerated or reduced for convenience of explanation. As an example, the size and thickness of each element shown in the drawings are arbitrarily represented for convenience of description, and thus, the disclosure is not necessarily limited thereto.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different orientations that are not perpendicular to one another.

In the case where a certain embodiment may be implemented differently, a specific process order may be performed in the order different from the described order. As an example, two processes successively described may be simultaneously performed substantially and performed in the opposite order.

FIG. 1 is a schematic plan view of a display apparatus 1 according to an embodiment.

Referring to FIG. 1, the display apparatus 1 may include a display area DA and a peripheral area PA outside the display area DA. The display apparatus 1 may be configured to display images by using light emitted from a plurality of pixels P disposed in the display area DA.

The display area DA may include the pixels P, wherein each of the pixels P are connected to a scan line SL extending in an x direction and a data line DL extending in a y direction crossing the x direction. Each pixel P is connected to a driving voltage line PL extending in the y direction.

Each of the pixels P may include a display element such as an organic light-emitting diode OLED. Each pixel P may be configured to emit, for example, red, green, blue, or white light from the organic light-emitting diode OLED. In the present specification, the pixel P may be understood as a sub-pixel that is configured to emit light having one of red, green, blue, and white colors. In an embodiment, all of the organic light-emitting diodes OLED included in the pixels P may be configured to emit light of the same color, and the colors of the respective pixels P may be implemented by color filters and the like disposed on the organic light-emitting diodes OLED.

Each pixel P may be electrically connected to built-in circuits disposed in the peripheral area PA. A built-in driving circuit portion 40, a terminal portion 30, a first power supply line 10, and a second power supply line (not shown) may be disposed in the peripheral area PA.

The built-in driving circuit portion 40 may include a plurality of thin-film transistors and be configured to provide scan signals to each pixel P through the scan line SL. The built-in driving circuit portions 40 may be disposed on two opposite sides with the display area DA therebetween. Some of the pixels P disposed in the display area DA may be electrically connected to the built-in driving circuit portion 40 disposed on the left, and the rest of the pixels P may be electrically connected to the built-in driving circuit portion 40 disposed on the right. In an embodiment, the built-in driving circuit portion 40 may be disposed on only one side of the display area DA.

The terminal portion 30 may be disposed on one side of a substrate 100. The terminal portion 30 may be exposed by not being covered by an insulating layer, and electrically connected to a printed circuit board PCB. A terminal PCB-P of the printed circuit board PCB may be electrically connected to the terminal portion 30.

The printed circuit board PCB is configured to transfer signals or power of a controller (not shown) to the terminal portion 30. The controller may be configured to provide a driving voltage to the first power supply line 10 through a first connection line 11. The driving voltage may be provided to each pixel P through the driving voltage line PL connected to the first power supply line 10. In addition, the controller may be configured to provide a common voltage to the second power supply line (not shown). The common voltage may be provided to an opposite electrode of the pixel P connected to the second power supply line.

Control signals generated by the controller may be transferred to the built-in driving circuit portion 40 through the printed circuit board PCB and a third connection line 41.

A data driving circuit 60 may be provided to the printed circuit board PCB. The data driving circuit 60 is electrically connected to the data line DL. A data signal of the data driving circuit 60 may be provided to each pixel P through a connection line 51 and the data line DL, wherein the connection line 51 is connected to the terminal portion 30, and the data line DL is connected to the connection line 51. In an embodiment, the data driving circuit 60 may be disposed on the substrate 100. As an example, the data driving circuit 60 may be disposed between the terminal portion 30 and the first power supply line 10.

Figure 2:
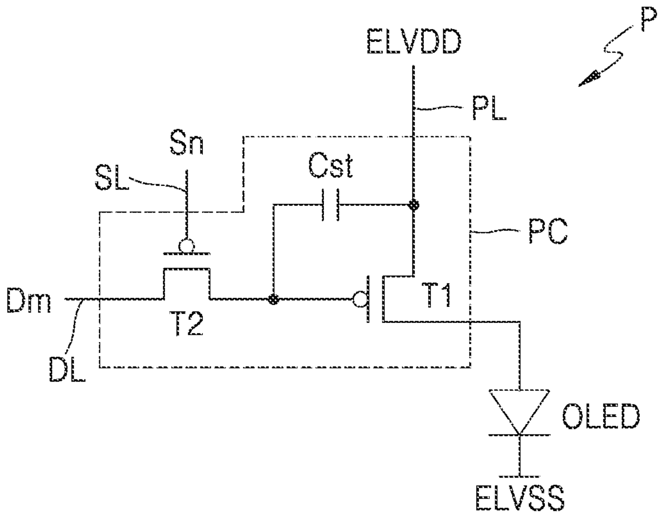
FIGS. 2 and 3 are equivalent circuit diagrams of a pixel of a display apparatus according to an embodiment.
Figure 3:
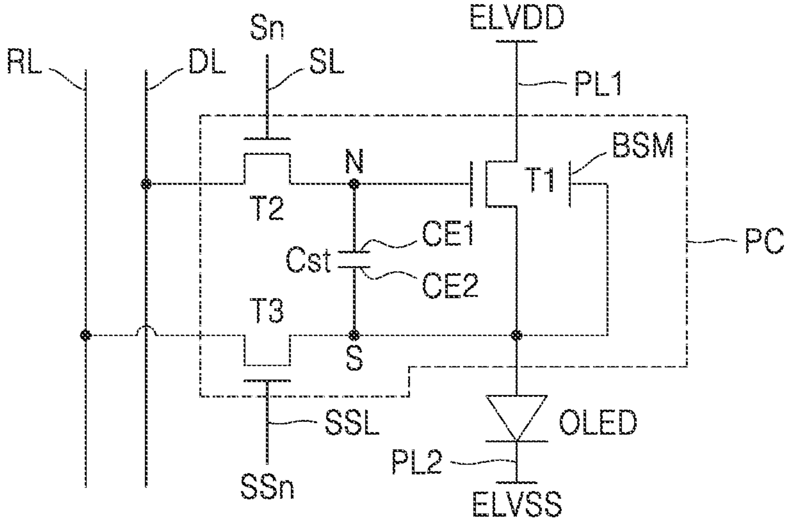

FIGS. 2 and 3 are equivalent circuit diagrams of a pixel of the display apparatus 1 according to an embodiment.

Referring to FIG. 2, each pixel P may include a pixel circuit PC and an organic light-emitting diode OLED connected to the pixel circuit PC, wherein the pixel circuit PC is connected to the scan line SL and the data line DL.

The pixel circuit PC includes a driving thin-film transistor T1, a switching thin-film transistor T2, and a storage capacitor Cst. The switching thin-film transistor T2 is connected to the scan line SL and the data line DL, and configured to transfer a data signal Dm to the driving thin-film transistor T1 according to a scan signal Sn, wherein the data signal Dm is input through the data line DL, and the scan signal Sn is input through the scan line SL.

The storage capacitor Cst is connected to the switching thin-film transistor T2 and the driving voltage line PL and configured to store a voltage corresponding to a difference between a voltage transferred from the switching thin-film transistor T2 and a first power voltage ELVDD (or a driving voltage) supplied to the driving voltage line PL.

The driving thin-film transistor T1 may be connected to the driving voltage line PL and the storage capacitor Cst and configured to control a driving current according to the voltage stored in the storage capacitor Cst, the driving current flowing from the driving voltage line PL to the organic light-emitting diode OLED. The organic light-emitting diode OLED may be configured to emit light having a preset brightness corresponding to the driving current.

Although it is described with reference to FIG. 2 that the pixel circuit PC includes two thin-film transistors and one capacitor, the embodiment is not limited thereto.

Referring to FIG. 3, each pixel P may include an organic light-emitting diode OLED and the pixel circuit PC driving the organic light-emitting diode OLED, wherein the pixel circuit PC includes a plurality of thin-film transistors. The pixel circuit PC may include a driving thin-film transistor T1, a switching thin-film transistor T2, a sensing thin-film transistor T3, and a storage capacitor Cst.

The scan line SL may be connected to a gate electrode of the switching thin-film transistor T2, the data line DL may be connected to a source electrode of the switching thin-film transistor T2, and a first electrode CE1 of the storage capacitor Cst may be connected to a drain electrode of the switching thin-film transistor T2.

Accordingly, the switching thin-film transistor T2 may be configured to supply a data voltage of the data line DL to a first node N in response to a scan signal Sn from the scan line SL of each pixel P.

A gate electrode of the driving thin-film transistor T1 may be connected to the first node N, a source electrode of the driving thin-film transistor T1 may be connected to a first power line PL1 configured to transfer the first power voltage ELVDD, and a drain electrode of the driving thin-film transistor T1 may be connected to an anode electrode of the organic light-emitting diode OLED.

Accordingly, the driving thin-film transistor T1 may be configured to adjust the amount of current flowing through the organic light-emitting diode OLED according to a source-gate voltage of itself, that is, a voltage applied between the driving power voltage ELVDD and the first node N.

A sensing control line SSL is connected to a gate electrode of the sensing thin-film transistor T3, a source electrode of the sensing thin-film transistor T3 is connected to a second node S, and a drain electrode of the sensing thin-film transistor T3 is connected to a reference voltage line RL. In an embodiment, the sensing thin-film transistor T3 may be controlled by the scan line SL instead of the sensing control line SSL.

The sensing thin-film transistor T3 may sense an electric potential of the anode electrode of the organic light-emitting diode OLED. The sensing thin-film transistor T3 may be configured to supply a pre-charging voltage from the reference voltage line RL to the second node S in response to a sensing signal SSn from the sensing control line SSL, or supply a voltage of the anode electrode of the organic light-emitting diode OLED to the reference voltage line RL during a sensing period.

The first electrode CE1 of the storage capacitor Cst is connected to the first node N, and a second electrode CE2 is connected to the second node S. The storage capacitor Cst is charged with a difference voltage between voltages respectively supplied to the first and second nodes N and S, and is configured to supply the difference voltage as a driving voltage of the driving thin-film transistor T1. As an example, the storage capacitor Cst may be charged with a difference voltage between a voltage of a data signal Dm and a pre-charging voltage Vpre respectively supplied to the first and second nodes N and S.

A bias electrode BSM may be formed to correspond to the driving thin-film transistor T1 and connected to the source electrode of the sensing thin-film transistor T3. Because the bias electrode BSM receives a voltage in cooperation with the potential of the source electrode of the sensing thin-film transistor T3, the driving thin-film transistor T1 may be stabilized. In an embodiment, the bias electrode BSM may not be connected to the source electrode of the sensing thin-film transistor T3 but may be connected to a separate bias line.

An opposite electrode, e.g., a cathode, of the organic light-emitting diode OLED is configured to receive a common power voltage ELVSS. The organic light-emitting diode OLED is configured to emit light by receiving the driving current from the driving thin-film transistor T1.

Although FIG. 3 shows the case where signal lines, that is, the scan line SL, the sensing control line SSL, and the data line DL, a reference voltage line RL, the first power line PL1, and a second power line PL2 are provided for each pixel P, the embodiment is not limited thereto. As an example, at least one of the signals lines, that is, the scan line SL, the sensing control line SSL, and the data line DL, and/or the reference voltage line RL, the first power line PL1, and a second power line PL2 may be shared by adjacent pixels.

The pixel circuit PC is not limited to the number of thin-film transistors, the number of storage capacitors, and the circuit design described with reference to FIGS. 2 and 3, and the number of thin-film transistors, the number of storage capacitors, and the circuit design may be variously changed.

Figure 4:
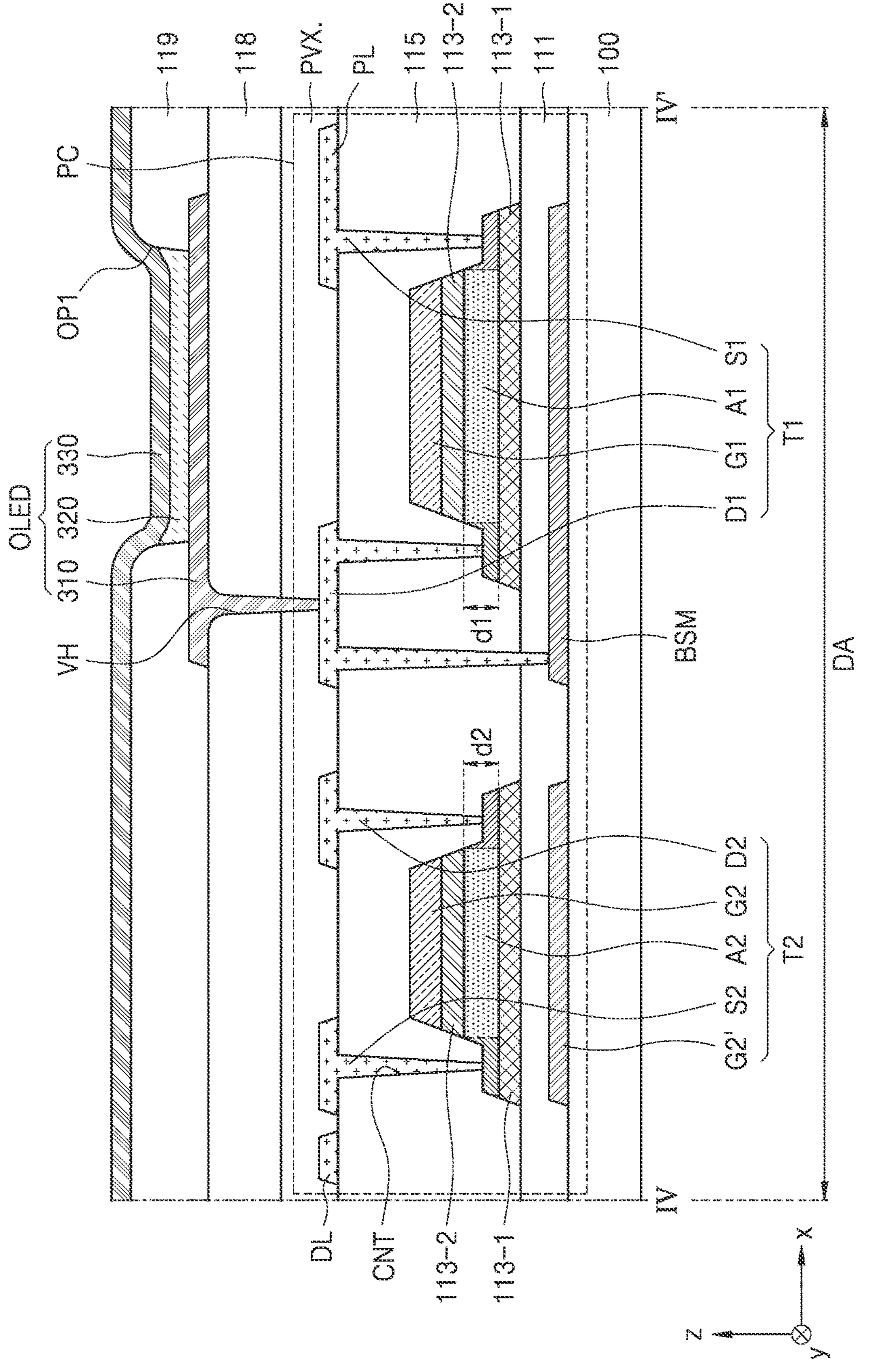
FIG. 4 is a schematic cross-sectional view of the display apparatus according to an embodiment.

FIG. 4 is a schematic cross-sectional view of the display apparatus 1 according to an embodiment, taken along line IV-IV' of FIG. 1.

Referring to FIG. 4, the display apparatus 1 includes the pixel circuit PC disposed in the display area DA, and the organic light-emitting diode OLED connected to the pixel circuit PC, wherein the organic light-emitting diode OLED serves as a display element. The pixel circuit PC may include the driving thin-film transistor T1 and the switching thin-film transistor T2.

The driving thin-film transistor T1 and the switching thin-film transistor T2 are shown in the display area DA of FIG. 4 in the pixel circuit PC of the pixel P described with reference to FIGS. 2 and 3. For convenience of description, the elements disposed in FIG. 4 are described according to a stack order.

The substrate 100 may include glass, a ceramic material, a metal material, or a polymer resin material such as polyimide. The substrate 100 may have a single-layered structure or a multi-layered structure of the above materials, and may further include an inorganic layer in the case of the multi-layered structure.

The bias electrode BSM may be disposed on the substrate 100 to correspond to the driving thin-film transistor T1. That is, the bias electrode BSM may be formed to overlap a driving semiconductor layer A1 of the driving thin-film transistor T1. A voltage may be applied to the bias electrode BSM. As an example, the bias electrode BSM may be connected to a source electrode of the sensing thin-film transistor T3, e.g., see FIG. 3, to receive a voltage of the source electrode of the sensing thin-film transistor T3. In addition, the bias electrode BSM may prevent external light from reaching the semiconductor layer A1. Accordingly, the characteristics of the driving thin-film transistor T1 may be stabilized. In addition, the bias electrode BSM may be omitted depending on the case.

A buffer layer 111 may cover the bias electrode BSM and be formed on the substrate 100 entirely. The buffer layer 111 may prevent or reduce the penetration of impurities from the substrate 100 and the like to the semiconductor layers A1 and A2. The buffer layer 111 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). Although not shown, a lower buffer layer (not shown) may be disposed between the substrate 100 and the bias electrode BSM.

The driving semiconductor layer A1 of the driving thin-film transistor T1 and a switching semiconductor layer A2 of the switching thin-film transistor T2 may be disposed on the buffer layer 111. Each of the driving semiconductor layer A1 and the switching semiconductor layer A2 may include an oxide semiconductor material.

A first gate insulating layer 113-1 may be disposed between the driving semiconductor layer A1 and the buffer layer 111 and between the switching semiconductor layer A2 and the buffer layer 111. The first gate insulating layer 113-1 may be disposed on the buffer layer 111. The first gate insulating layer 113-1 may be disposed under the driving semiconductor layer A1 to correspond to the driving semiconductor layer A1. In addition, the first gate insulating layer 113-1 may be disposed under the switching semiconductor layer A2 to correspond to the switching semiconductor layer A2.

The first gate insulating layer 113-1 may include an inorganic insulating material. As an example, the first gate insulating layer 113-1 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

Each of the driving semiconductor layer A1 and the switching semiconductor layer A2 may include a channel region, a drain region, and a source region, the drain region and the source region being on two opposite sides of the channel region.

A second gate insulating layer 113-2 may be disposed on the driving semiconductor layer A1 and the switching semiconductor layer A2. The second gate insulating layer 113-2 may be disposed on the channel region of the driving semiconductor layer A1 to correspond to the channel region of the driving semiconductor layer A1. In addition, the second gate insulating layer 113-2 may be disposed on the channel region of the switching semiconductor layer A2 to correspond to the channel region of the switching semiconductor layer A2.

The second gate insulating layer 113-2 may include an inorganic insulating material. The second gate insulating layer 113-2 and the first gate insulating layer 113-1 may include the same material. As an example, the second gate insulating layer 113-2 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

Driving and switching gate electrodes G1 and G2 may be disposed on the second gate insulating layer 113-2. The driving gate electrode G1 may be disposed on the second gate insulating layer 113-2 to correspond to the second gate insulating layer 113-2 disposed on the driving semiconductor layer A1. In addition, the switching gate electrode G2 may be disposed on the second gate insulating layer 113-2 to correspond to the second gate insulating layer 113-2 disposed on the switching semiconductor layer A2. Each of the driving and switching gate electrodes G1 and G2 may include a metal material. As an example, each of the driving and switching gate electrodes G1 and G2 may include at least one of molybdenum (Mo), aluminum (Al), copper (Cu), titanium (Ti) and the like and include a single layer or a multi-layer.

An interlayer insulating layer 115 may be disposed on the buffer layer 111. The interlayer insulating layer 115 may cover the first gate insulating layer 113-1, the driving semiconductor layer A1, the switching semiconductor layer A2, the second gate insulating layer 113-2, and the driving and switching gate electrodes G1 and G2. As an example, the interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

A driving source electrode S1, a driving drain electrode D1 of the driving thin-film transistor T1, a switching source electrode S2, a switching drain electrode D2 of the switching thin-film transistor T2, the data line DL, and the driving voltage line PL may be disposed on the interlayer insulating layer 115.

The driving source electrode S1, the driving drain electrode D1 of the driving thin-film transistor T1, the switching source electrode S2, the switching drain electrode D2 of the switching thin-film transistor T2, the data line DL, and the driving voltage line PL may include a conductive material including molybdenum (Mo), aluminum (Al), copper (Cu), and titanium (Ti), and include a single layer or a multi-layer including the above materials. The driving and switching source electrodes S1 and S2 and the driving and switching drain electrodes D1 and D2 may be respectively connected to source regions or drain regions of the driving and switching semiconductor layers A1 and A2 through contact holes CNT. In addition, the driving drain electrode D1 may be connected to the bias electrode BSM through a contact hole CNT.

The driving source electrode S1, the driving drain electrode D1 of the driving thin-film transistor T1, the switching source electrode S2, the switching drain electrode D2 of the switching thin-film transistor T2, the data line DL, and the driving voltage line PL may be covered by a protective layer PVX.

The protective layer PVX may include an inorganic insulating layer of a single layer or a multi-layer including silicon nitride ($SiN_x$) and silicon oxide (SiOx). Alternatively, the protective layer PVX may include an organic insulating layer. The protective layer PVX may be introduced to cover and protect some of the wirings disposed on the interlayer insulating layer 115. Wirings (not shown) formed together during the same process as a process of forming the data line DL may be exposed in a partial region, e.g., a portion of the peripheral area, of the substrate 100. An exposed portion of the wirings may be damaged by etchant used when a pixel electrode 310 is patterned. Because the protective layer PVX covers the data line DL and at least some of the wirings formed together with the data line DL according to an embodiment, the wirings may be prevented from being damaged during the process of patterning the pixel electrode 310.

A planarization layer 118 may be disposed on the protective layer PVX, and the organic light-emitting diode OLED may be disposed on the planarization layer 118.

The planarization layer 118 may include a single layer or a multi-layer including an organic material and provide a flat upper surface. The planarization layer 118 may include a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

The organic light-emitting diode OLED is disposed on the planarization layer 118 in the display area DA of the substrate 100. The organic light-emitting diode OLED includes the pixel electrode 310, an intermediate layer 320, and an opposite electrode 330, wherein the intermediate layer 320 includes an organic emission layer.

The pixel electrode 310 may be a (semi) light-transmissive electrode or a reflective electrode. In an embodiment, the pixel electrode 310 may include a reflective layer and a transparent or semi-transparent electrode layer on the reflective layer, wherein the reflective layer includes at least one of Ag, Mg, Al, Pt, Pd, Au, Ni, Nd, Ir, Cr, and compound thereof. The transparent or semi-transparent electrode layer may include at least one of indium tin oxide (ITO), indium zinc oxide (IZO), zinc oxide (ZnO), indium oxide ($In_2O_3$), indium gallium oxide (IGO), and aluminum zinc oxide (AZO). In an embodiment, the pixel electrode 310 may include ITO/Ag/ITO.

A pixel-defining layer 119 may be disposed on the planarization layer 118. The pixel-defining layer 119 may define an emission area of a pixel by including an opening corresponding to each sub-pixel in the display area DA, that is, a first opening OP1 extending to and exposing at least a central portion of the pixel electrode 310. In addition, the pixel-defining layer 119 may prevent arcs and the like from occurring at the edges of each pixel electrode 310 by increasing a distance between the edges of each pixel electrode 310 and the opposite electrode 330 over the pixel electrode 310.

The pixel-defining layer 119 may include an organic insulating material such as polyimide, an acrylic resin, benzocyclobutene, a phenolic resin, and the like and be formed by using spin coating and the like.

The intermediate layer 320 of the organic light-emitting diode OLED may include the organic emission layer. The organic emission layer may include an organic material including a fluorescent or phosphorous material configured to emit red, green, blue, or white light. The organic emission layer may include a polymer organic material or a low molecular weight organic material. Functional layers may be selectively further disposed under and on the organic emission layer, the functional layers including a hole transport layer (HTL), a hole injection layer (HIL), an electron transport layer (ETL), and an electron injection layer (EIL). The intermediate layer 320 may be disposed to correspond to each of the plurality of pixel electrodes 310. However, the embodiment is not limited thereto. The intermediate layer 320 may include a layer that is one body over the plurality of pixel electrodes 310. However, various modifications may be made.

The opposite electrode 330 may be a light-transmissive electrode or a reflective electrode. In an embodiment, the opposite electrode 330 may be a transparent or semi-transparent electrode and may include a metal thin film including Li, Ca, LiF/Ca, LiF/Al, Al, Ag, Mg, or compound thereof and having a small work function. In addition, a transparent conductive oxide (TCO) layer such as ITO, IZO, ZnO, or $In_2O_3$ may be further disposed on the metal thin film. The opposite electrode 330 may be disposed over the display area DA and the peripheral area PA, and disposed on the intermediate layer 320 and the pixel-defining layer 119. The opposite electrode 330 may be formed as one body over the plurality of organic light-emitting diodes OLED to correspond to the plurality of pixel electrodes 310.

As shown, the pixel electrode 310 may be directly connected to the driving drain electrode D1 of the driving thin-film transistor T1 through a via hole VH, or may be electrically connected to the driving drain electrode D1 through an intermediate medium such as a connection electrode.

The switching thin-film transistor T2 may be provided in a double gate structure. That is, a lower gate electrode G2' may disposed below the switching semiconductor layer A2 to overlap the switching semiconductor layer A2. The lower gate electrode G2' may include the same material as a material of the bias electrode BSM, and be disposed on the same layer as a layer on which the bias electrode BSM is disposed. The lower gate electrode G2' may be electrically connected to the switching gate electrode G2. Because the switching thin-film transistor T2 is provided in a double gate structure, the switching thin-film transistor T2 may have a higher electron mobility.

Figure 5:
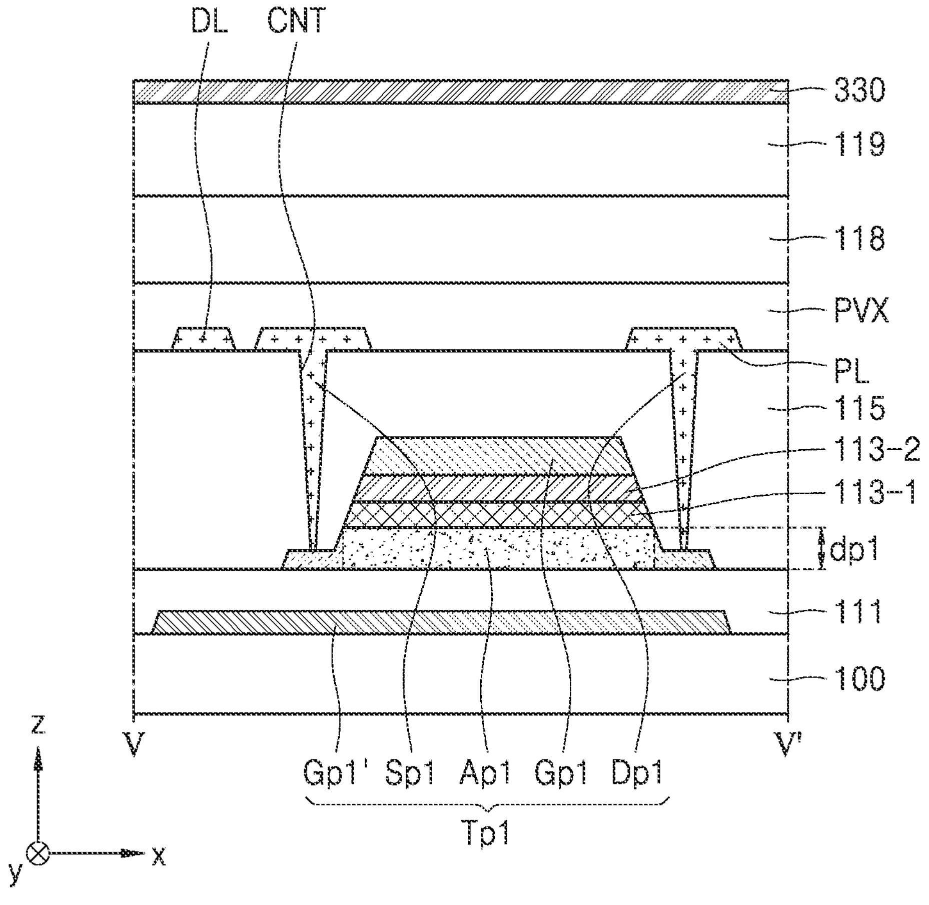
FIG. 5 is a schematic cross-sectional view of a display apparatus according to an embodiment.

FIG. 5 is a schematic cross-sectional view of the display apparatus 1 according to an embodiment, taken along line V-V' of FIG. 1.

In FIG. 5, the same reference numerals as those of FIG. 4 denote the same members, and thus, repeated descriptions thereof are omitted.

Referring to FIG. 5, a first peripheral thin-film transistor Tp1 is disposed in the peripheral area PA of the substrate 100, wherein the first peripheral thin-film transistor Tp1 is included the built-in driving circuit portion 40, e.g., see FIG. 1. For convenience of description, the elements disposed in FIG. 5 are described according to a stack order.

The buffer layer 111 may be disposed on the substrate 100. The buffer layer 111 may prevent or reduce the penetration of impurities from the substrate 100 and the like to a first peripheral semiconductor layer Ap1.

The first peripheral semiconductor layer Ap1 of the first peripheral thin-film transistor Tp1 may be disposed on the buffer layer 111. The first peripheral semiconductor layer Ap1 may include an oxide semiconductor material.

The first peripheral semiconductor layer Ap1 may include a channel region, a drain region, and a source region, the drain region and the source region being on two opposite sides of the channel region.

The first gate insulating layer 113-1 may be disposed on the first peripheral semiconductor layer Ap1. The first gate insulating layer 113-1 may be disposed on a channel region of the first peripheral semiconductor layer Ap1 to correspond to the channel region of the first peripheral semiconductor layer Ap1. The second gate insulating layer 113-2 may be disposed on the first gate insulating layer 113-1 in the peripheral area PA. The second gate insulating layer 113-2 may be disposed on the first gate insulating layer 113-1 to correspond to the first gate insulating layer 113-1 disposed on the first peripheral semiconductor layer Ap1.

A first peripheral gate electrode Gp1 may be disposed on the second gate insulating layer 113-2. The first peripheral gate electrode Gp1 may be disposed on the second gate insulating layer 113-2 to correspond to the second gate insulating layer 113-2 disposed on the first peripheral semiconductor layer Ap1.

The interlayer insulating layer 115 may be disposed on the buffer layer 111. The interlayer insulating layer 115 may cover the first peripheral semiconductor layer Ap1, the first gate insulating layer 113-1, the second gate insulating layer 113-2, and the first peripheral gate electrode Gp1.

A first peripheral source electrode Sp1 of the first peripheral thin-film transistor Tp1, a first peripheral drain electrode Dp1 of the first peripheral thin-film transistor Tp1, the data line DL, and the driving voltage line PL may be disposed on the interlayer insulating layer 115. The first peripheral source electrode Sp1 and the first peripheral drain electrode Dp1 may be connected to a source region or a drain region of the first peripheral semiconductor layer Ap1 through a contact hole CNT.

The first peripheral source electrode Sp1 of the first peripheral thin-film transistor Tp1, the first peripheral drain electrode Dp1 of the first peripheral thin-film transistor Tp1, the data line DL, and the driving voltage line PL may be covered by the protective layer PVX. The planarization layer 118 may be disposed on the protective layer PVX. The pixel-defining layer 119 may be disposed on the planarization layer 118. The opposite electrode 330 may be disposed on the pixel-defining layer 119.

The first peripheral thin-film transistor Tp1 may be provided in a double gate structure. That is, a lower gate electrode Gp1' may disposed below the first peripheral semiconductor layer Ap1 to overlap the first peripheral semiconductor layer Ap1. The lower gate electrode Gp1' may include the same material as a material of the bias electrode BSM, e.g., see FIG. 4, and be disposed on the same layer as a layer on which the bias electrode BSM is disposed. The lower gate electrode Gp1' may be electrically connected to the first peripheral gate electrode Gp1. Because the first peripheral thin-film transistor Tp1 is provided in a double gate structure, the first peripheral thin-film transistor Tp1 may have a higher electron mobility.

Figure 6:
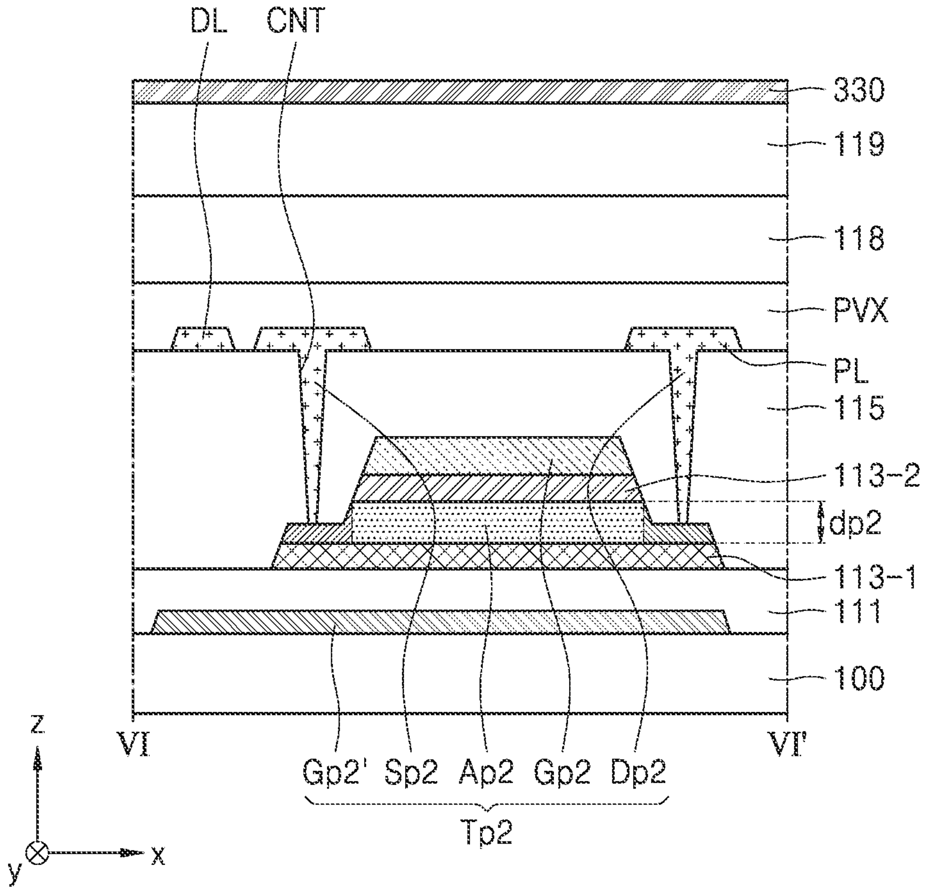
FIG. 6 is a schematic cross-sectional view of a display apparatus according to an embodiment.

FIG. 6 is a schematic cross-sectional view of the display apparatus 1 according to an embodiment, taken along line VI-VI' of FIG. 1.

In FIG. 6, the same reference numerals as those of FIG. 4 denote the same members, and thus, repeated descriptions thereof are omitted.

Referring to FIG. 6, a second peripheral thin-film transistor Tp2 is disposed in the peripheral area PA of the substrate 100, wherein the second peripheral thin-film transistor Tp2 is included the built-in driving circuit portion 40, e.g., see FIG. 1. For convenience of description, the elements disposed in FIG. 6 are described according to a stack order.

The buffer layer 111 may be disposed on the substrate 100. The buffer layer 111 may prevent or reduce the penetration of impurities from the substrate 100 and the like to a second peripheral semiconductor layer Ap2.

The second peripheral semiconductor layer Ap2 of the second peripheral thin-film transistor Tp2 may be disposed on the buffer layer 111. The second peripheral semiconductor layer Ap2 may include an oxide semiconductor material.

The first gate insulating layer 113-1 may be disposed between the second peripheral semiconductor layer Ap2 and the buffer layer 111. The first gate insulating layer 113-1 may be disposed on the buffer layer 111. The first gate insulating layer 113-1 may be disposed under the second peripheral semiconductor layer Ap2 to correspond to the second peripheral semiconductor layer Ap2.

The second peripheral semiconductor layer Ap2 may include a channel region, a drain region, and a source region, the drain region and the source region being on two opposite sides of the channel region.

The second gate insulating layer 113-2 may be disposed on the second peripheral semiconductor layer Ap2. The second gate insulating layer 113-2 may be disposed on a channel region of the second peripheral semiconductor layer Ap2 to correspond to the channel region of the second peripheral semiconductor layer Ap2.

A second peripheral gate electrode Gp2 may be disposed on the second gate insulating layer 113-2. The second peripheral gate electrode Gp2 may be disposed on the second gate insulating layer 113-2 to correspond to the second gate insulating layer 113-2 disposed on the second peripheral semiconductor layer Ap2.

The interlayer insulating layer 115 may be disposed on the buffer layer 111. The interlayer insulating layer 115 may cover the second peripheral semiconductor layer Ap2, the first gate insulating layer 113-1, the second gate insulating layer 113-2, and the second peripheral gate electrode Gp2.

A second peripheral source electrode Sp2 of the second peripheral thin-film transistor Tp2, a second peripheral drain electrode Dp2 of the second peripheral thin-film transistor Tp2, the data line DL, and the driving voltage line PL may be disposed on the interlayer insulating layer 115. The second peripheral source electrode Sp2 and the second peripheral drain electrode Dp2 may be connected to a source region or a drain region of the second peripheral semiconductor layer Ap2 through a contact hole CNT.

The second peripheral source electrode Sp2 of the second peripheral thin-film transistor Tp2, the second peripheral drain electrode Dp2, the data line DL, and the driving voltage line PL may be covered by the protective layer PVX. The planarization layer 118 may be disposed on the protective layer PVX. The pixel-defining layer 119 may be disposed on the planarization layer 118. The opposite electrode 330 may be disposed on the pixel-defining layer 119.

The second peripheral thin-film transistor Tp2 may be provided in a double gate structure. That is, a lower gate electrode Gp2' may disposed below the second peripheral semiconductor layer Ap2 to overlap the second peripheral semiconductor layer Ap2. The lower gate electrode Gp2' may include the same material as a material of the bias electrode BSM, e.g., see FIG. 4, and be disposed on the same layer as a layer on which the bias electrode BSM is disposed. The lower gate electrode Gp2' may be electrically connected to the second peripheral gate electrode Gp2. Because the second peripheral thin-film transistor Tp2 is provided in a double gate structure, the second peripheral thin-film transistor Tp2 may have a higher electron mobility.

Referring to FIGS. 4 to 6, the driving semiconductor layer A1, the switching semiconductor layer A2, and the second peripheral semiconductor layer Ap2 may include the same material. In addition, the driving semiconductor layer A1, the switching semiconductor layer A2, and the second peripheral semiconductor layer Ap2 may include a material different from a material of the first peripheral semiconductor layer Ap1.

Each of the driving semiconductor layer A1, the switching semiconductor layer A2, and the second peripheral semiconductor layer Ap2 may have a mobility less than a mobility of the first peripheral semiconductor layer Ap1. That is, the first peripheral semiconductor layer Ap1 may have a higher mobility than a mobility of each of the driving semiconductor layer A1, the switching semiconductor layer A2, and the second peripheral semiconductor layer Ap2. Here, the second peripheral thin-film transistor Tp2 may be mostly an always-on transistor or a transistor vulnerable to a leakage current.

As an example, each of the driving semiconductor layer A1, the switching semiconductor layer A2, and the second peripheral semiconductor layer Ap2 may include indium gallium zinc oxide (IGZO). In addition, the first peripheral semiconductor layer Ap1 may include indium-tin-gallium-zinc-oxide (ITGZO).

A thickness d1 of the driving semiconductor layer A1, a thickness d2 of the switching semiconductor layer A2, and a thickness dp2 of the second peripheral semiconductor layer Ap2 may be identical to each other, i.e., may be the same. In addition, the thickness d1 of the driving semiconductor layer A1, the thickness d2 of the switching semiconductor layer A2, and the thickness dp2 of the second peripheral semiconductor layer Ap2 may be different from a thickness dp1 of the first peripheral semiconductor layer Ap1.

Thicknesses of the driving semiconductor layer A1, the switching semiconductor layer A2, and the second peripheral semiconductor layer Ap2 may be adjusted by taking into account a loss occurring during an etching process. However, because the first peripheral semiconductor layer Ap1 has a high mobility according to an increase in thickness, it may be difficult to increase a thickness thereof beyond a designated numerical value. Accordingly, the thickness d1 of the driving semiconductor layer A1, the thickness d2 of the switching semiconductor layer A2, and the thickness dp2 of the second peripheral semiconductor layer Ap2 may be thicker than the thickness dp1 of the first peripheral semiconductor layer Ap1.

Here, the thickness of the driving semiconductor layer A1 denotes a thickness of the driving semiconductor layer A1 in the channel region, the thickness of the switching semiconductor layer A2 denotes a thickness of the switching semiconductor layer A2 in the channel region, the thickness of the first peripheral semiconductor layer Ap1 denotes a thickness of the first peripheral semiconductor layer Ap1 in the channel region, and the thickness of the second peripheral semiconductor layer Ap2 denotes a thickness of the second peripheral semiconductor layer Ap2 in the channel region.

Because the driving semiconductor layer A1 and the switching semiconductor layer A2 include the same material, a number of contact holes connecting the driving semiconductor layer A1 and the switching semiconductor layer A2 to each other may be reduced. Accordingly, the area of the storage capacitor Cst, e.g., see FIGS. 2 and 3, may increase, and the occurrence of smear on the display apparatus may be reduced.

Because the first gate insulating layer 113-1 is disposed below the driving semiconductor layer A1, the switching semiconductor layer A2, and the second peripheral semiconductor layer Ap2, a distance between the driving semiconductor layer A1 and the driving gate electrode G1, a distance between the switching semiconductor layer A2 and the switching gate electrode G2, and a distance between the second peripheral semiconductor layer Ap2 and the second peripheral gate electrode Gp2 may be reduced. Accordingly, the magnitude of a voltage required for an electric field of a designated magnitude to be formed between the driving semiconductor layer A1 and the driving gate electrode G1, between the switching semiconductor layer A2 and the switching gate electrode G2, and between the second peripheral semiconductor layer Ap2 and the second peripheral gate electrode Gp2, may be reduced. Particularly, a required source-gate voltage of the driving thin-film transistor T1, e.g., see FIGS. 2 and 3, may be reduced, and thus, deterioration of the display apparatus may be reduced.

FIGS. 7A to 22C are schematic cross-sectional views for explaining a method of manufacturing a display apparatus according to an embodiment.

In FIGS. 7A to 22C, the same reference numerals as those of FIGS. 1 to 6 denote the same members, and thus, repeated descriptions thereof are omitted.

Figure 7A:
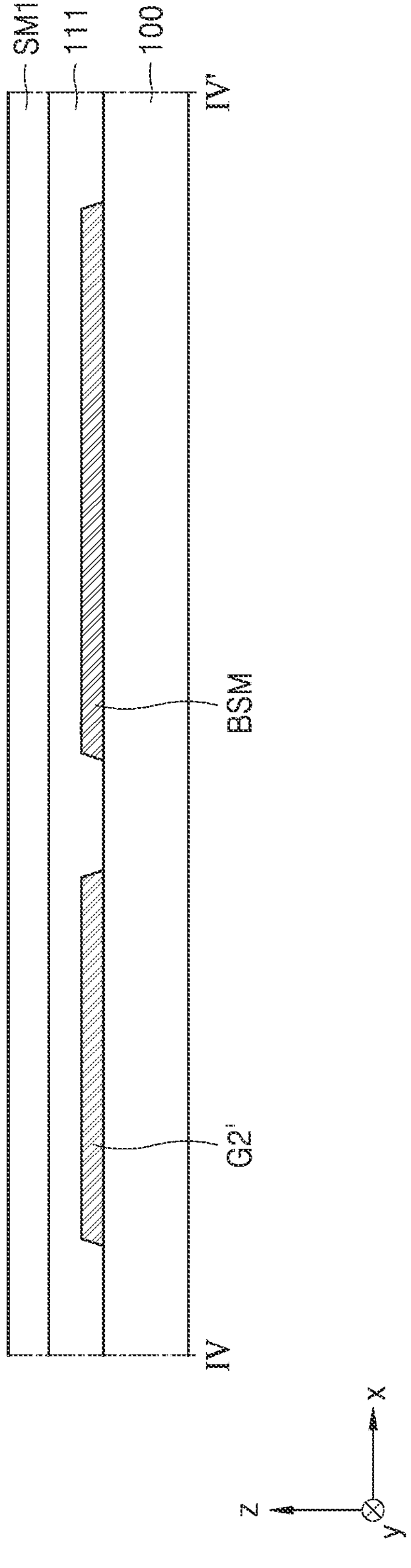
FIGS. 7A, 7B, 7C, 8A, 8B, 8C, 9A, 9B, 9C, 10A, 10B, 10C, 11A, 11B, 11C, 12A, 12B, 12C, 13A, 13B, 13C, 14A, 14B, 14C, 15A, 15B, 15C, 16A, 16B, 16C, 17A, 17B, 17C, 18A, 18B, 18C, 19A, 19B, 19C, 20A, 20B, 20C, 21A, 21B, 21C, 22A, 22B, to 22C are schematic cross-sectional views for explaining a method of manufacturing a display apparatus according to an embodiment.
Figure 7B:
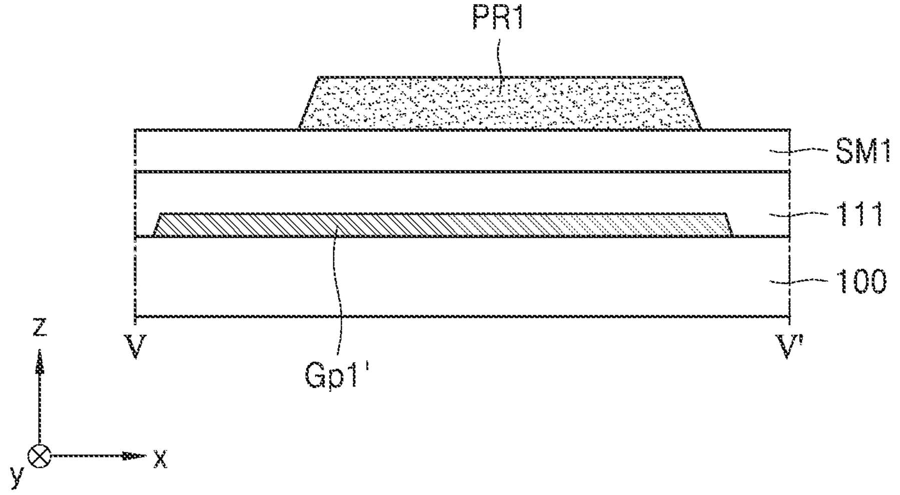
Figure 7C:
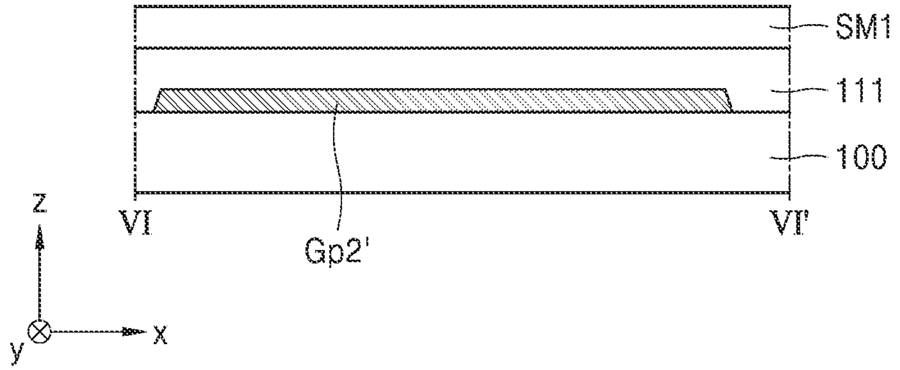

Referring to FIGS. 7A to 7C, a first semiconductor material layer SM1 may be formed on the buffer layer 111. The first semiconductor material layer SM1 may include indium-tin-gallium-zinc-oxide (ITGZO).

A first photoresist layer PR1 may be formed on the first semiconductor material layer SM1. The first photoresist layer PR1 may be disposed in a region in which the first peripheral thin-film transistor Tp1 is to be formed.

Figure 8A:
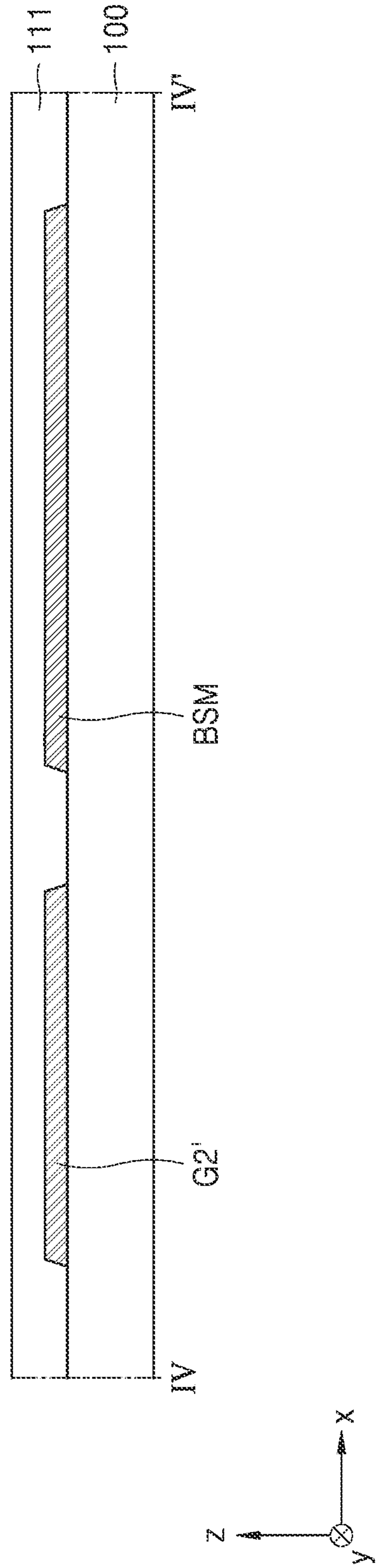
Figure 8B:
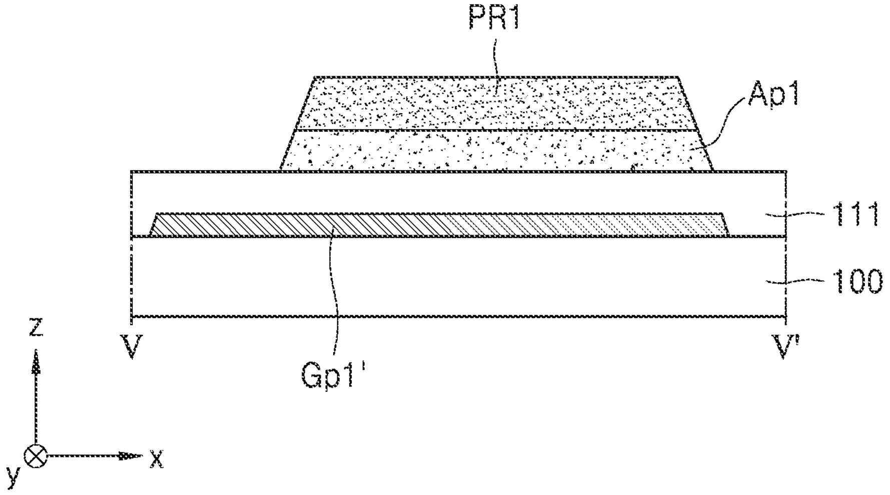
Figure 8C:
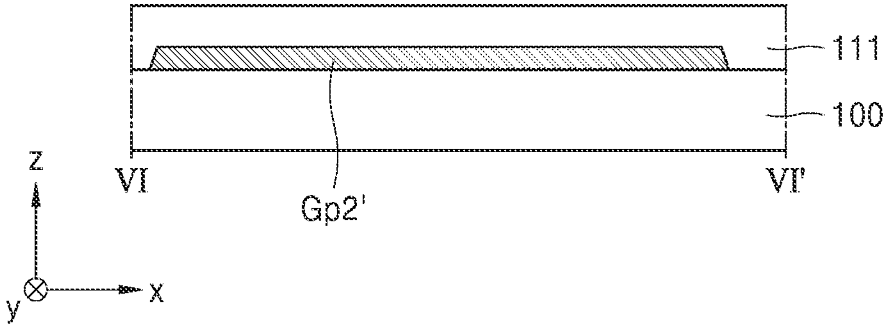

Referring to FIGS. 8A to 8C, the first semiconductor material layer SM1 may be etched by a first etching process. In the first etching process, the first semiconductor material layer SM1 is etched using the first photoresist layer PR1 as a mask. The first etching process may be a wet etching process using etchant. The first peripheral semiconductor layer Ap1 of the first peripheral thin-film transistor Tp1 may be formed by the first etching process.

Figure 9A:
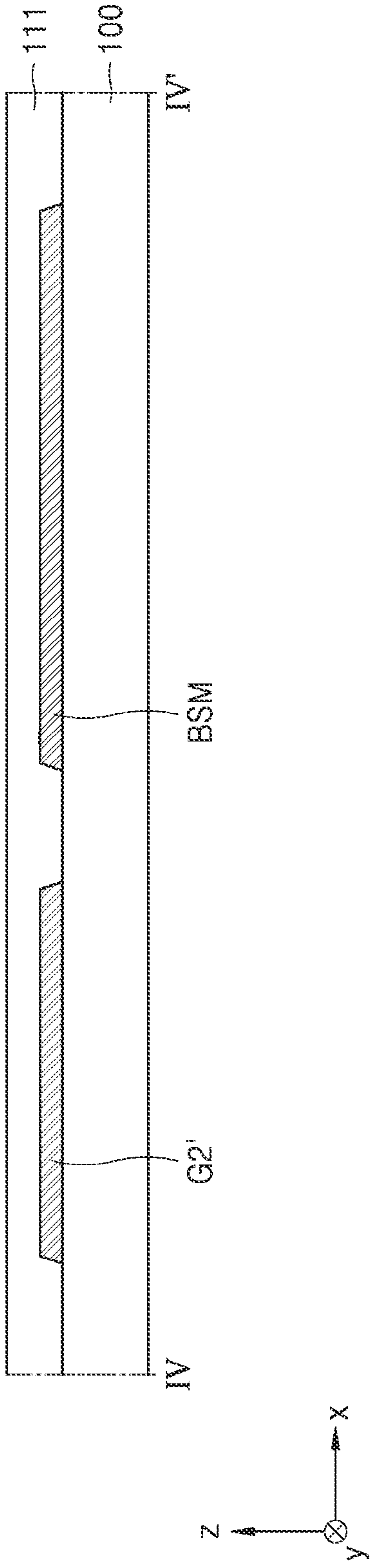
Figure 9B:
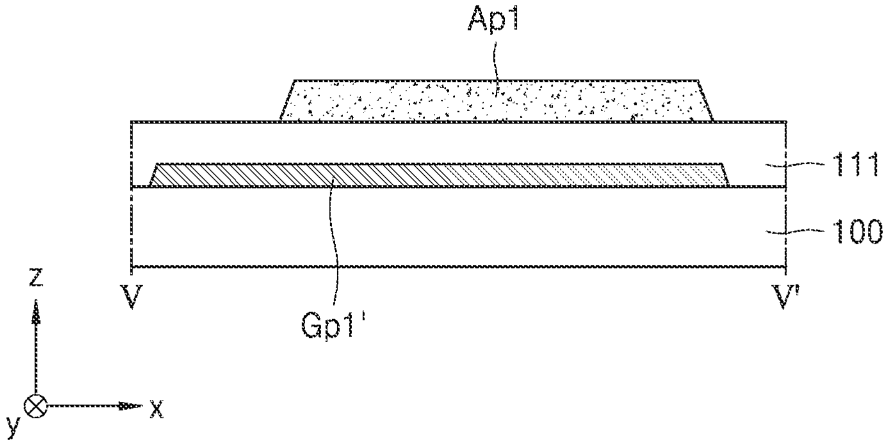
Figure 9C:
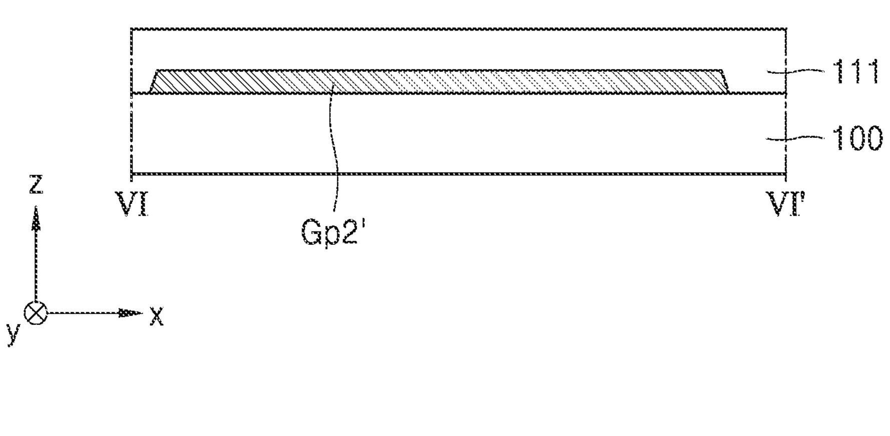

Referring to FIGS. 9A to 9C, the first photoresist layer PR1 remaining after the first etching process, e.g., see FIGS. 8A to 8C, may be removed.

Figure 10A:
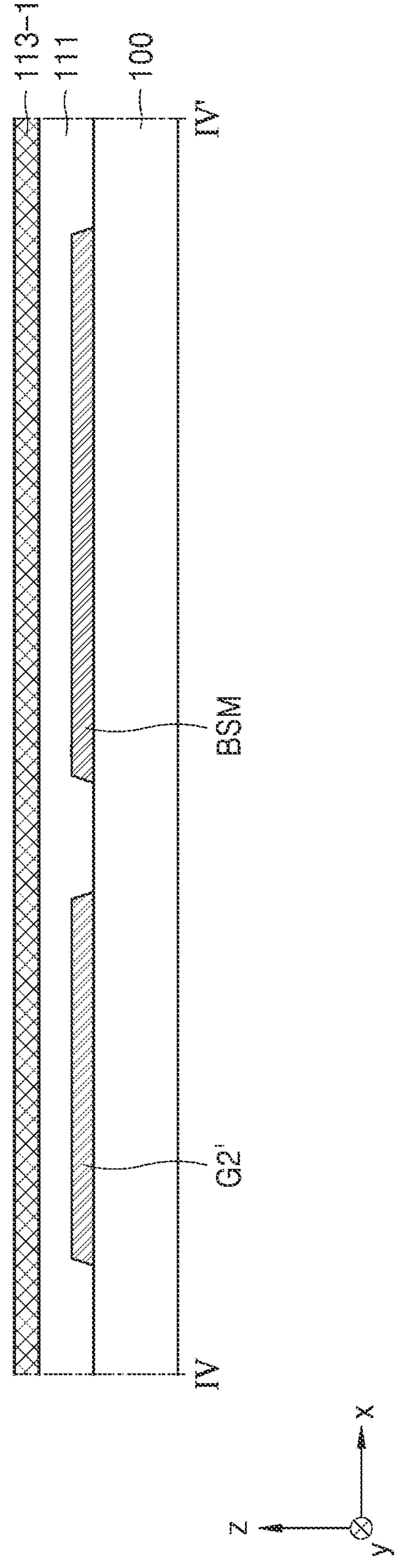
Figure 10B:
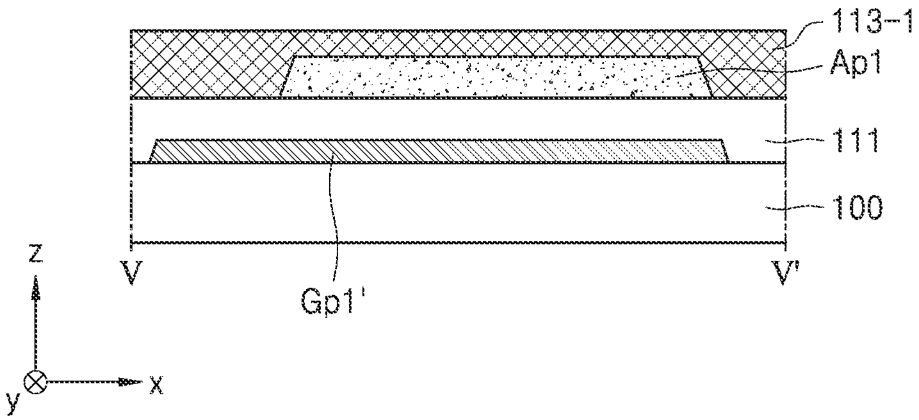
Figure 10C:
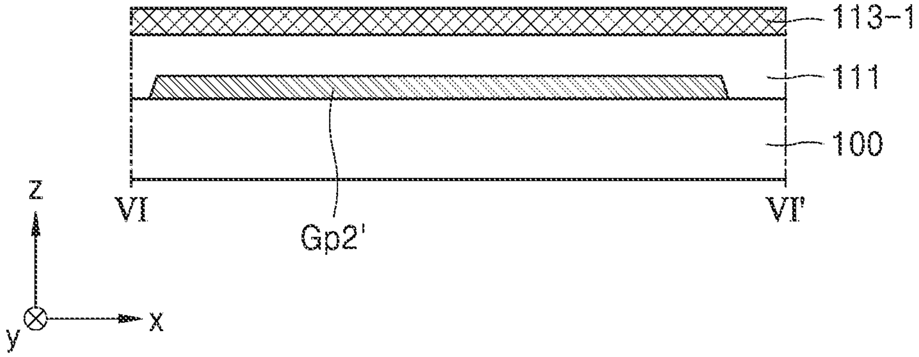

Referring to FIGS. 10A to 10C, the first gate insulating layer 113-1 may be formed on the buffer layer 111. The first gate insulating layer 113-1 may cover the buffer layer 111 and the first peripheral semiconductor layer Ap1.

Figure 11A:
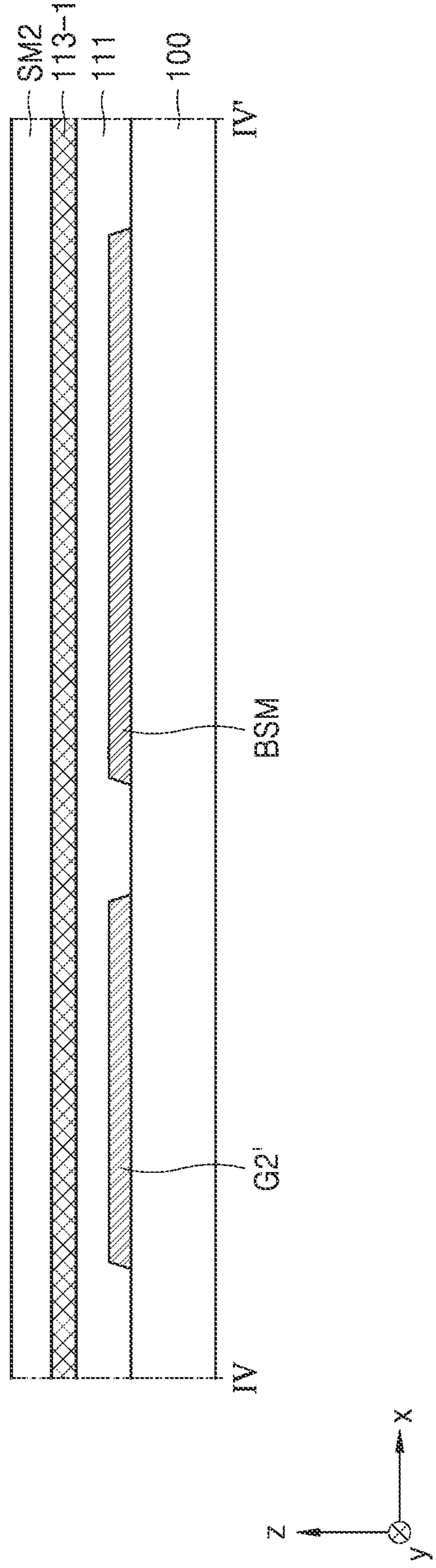
Figure 11B:
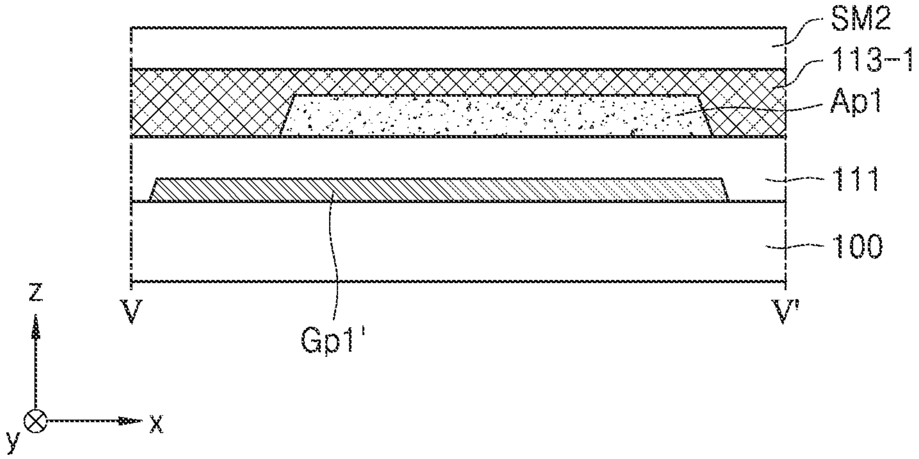
Figure 11C:
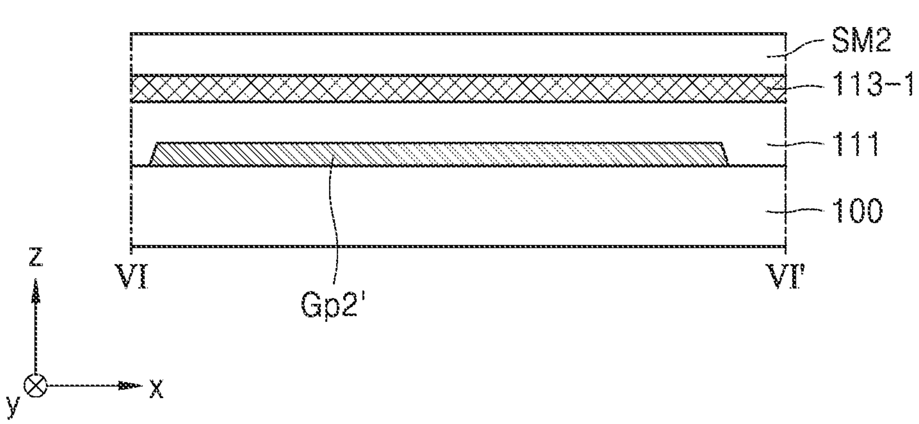

Referring to FIGS. 11A to 11C, a second semiconductor material layer SM2 may be formed on the first gate insulating layer 113-1. The second semiconductor material layer SM2 may include indium-gallium-zinc-oxide (IGZO).

Figure 12A:
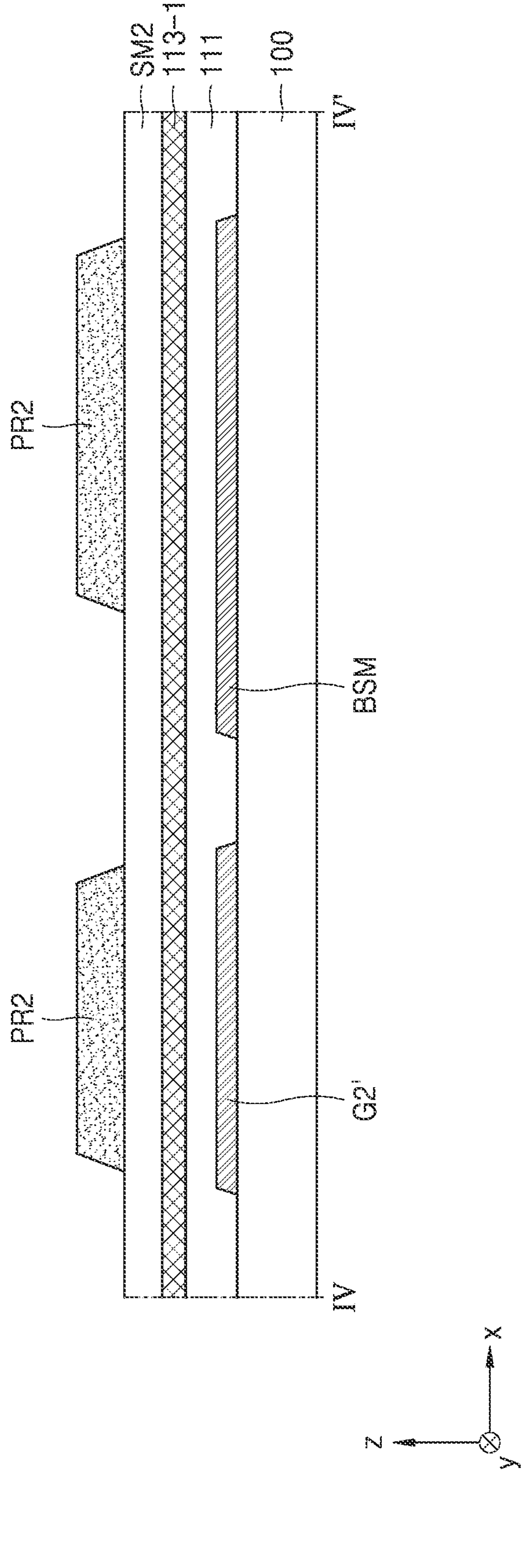
Figure 12B:
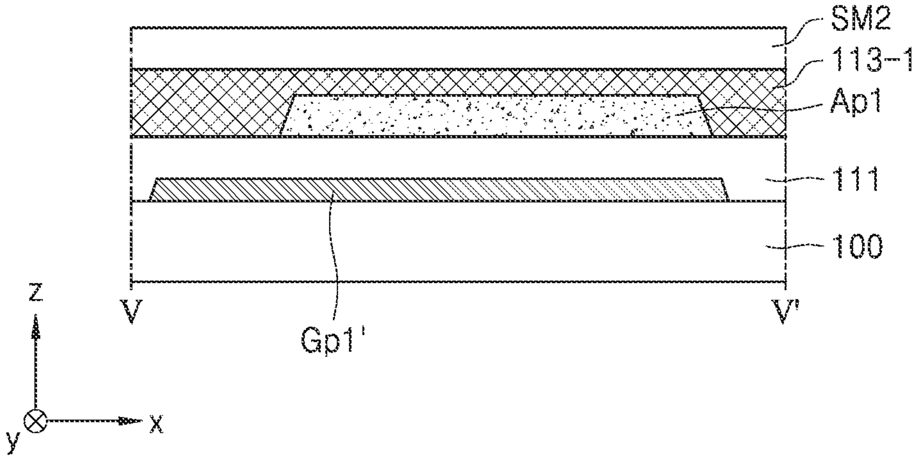
Figure 12C:
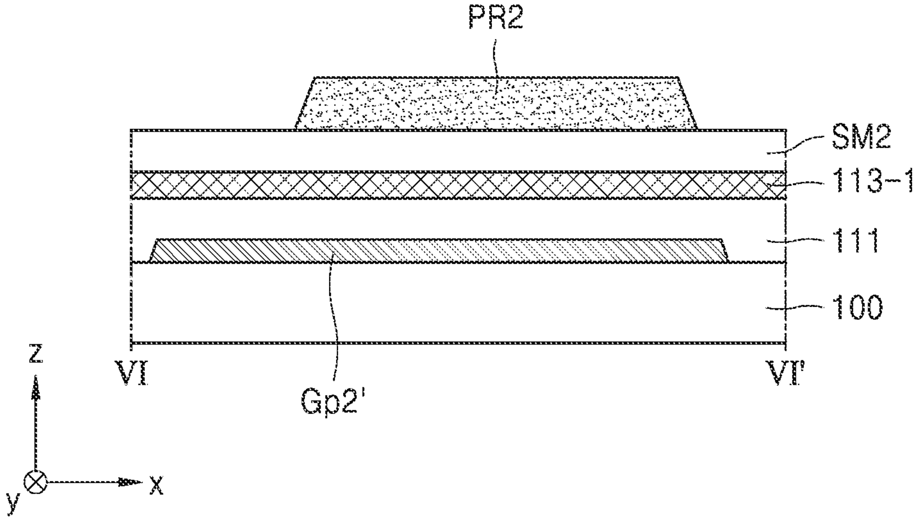

Referring to FIGS. 12A to 12C, a second photoresist layer PR2 may be formed on the second semiconductor material layer SM2. The second photoresist layer PR2 may be disposed in a region in which the driving thin-film transistor T1, the switching thin-film transistor T2, and the second peripheral thin-film transistor Tp2 are to be formed.

Figure 13A:
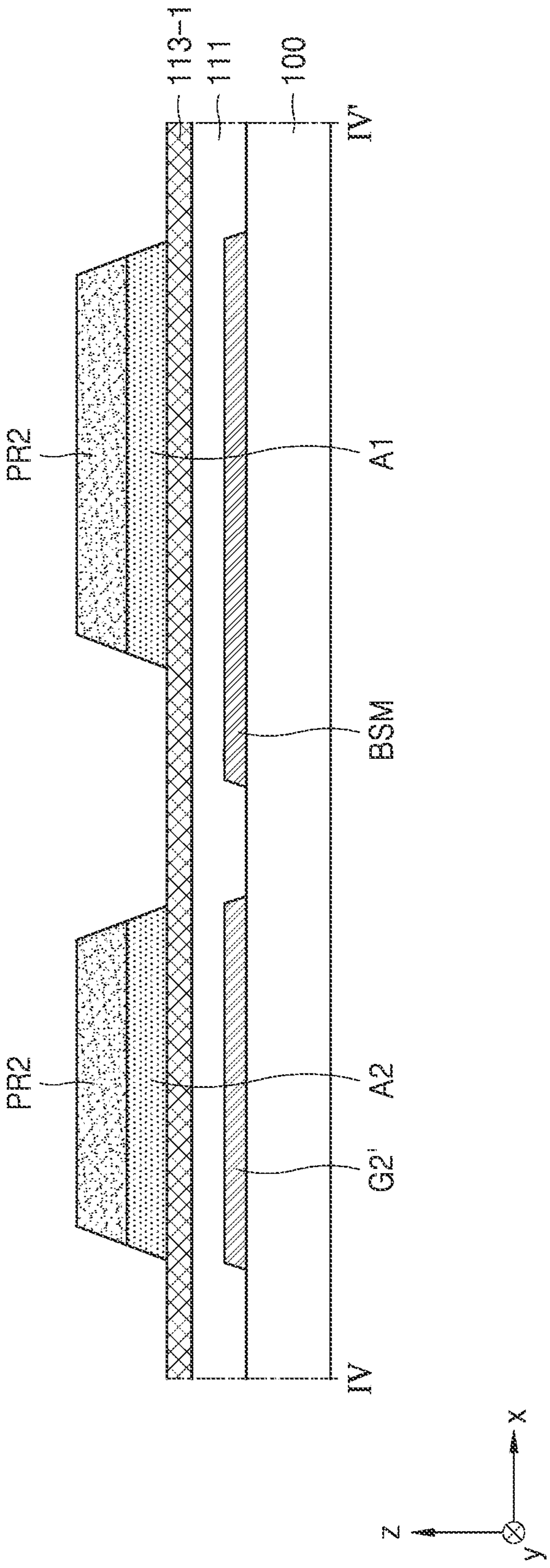
Figure 13B:
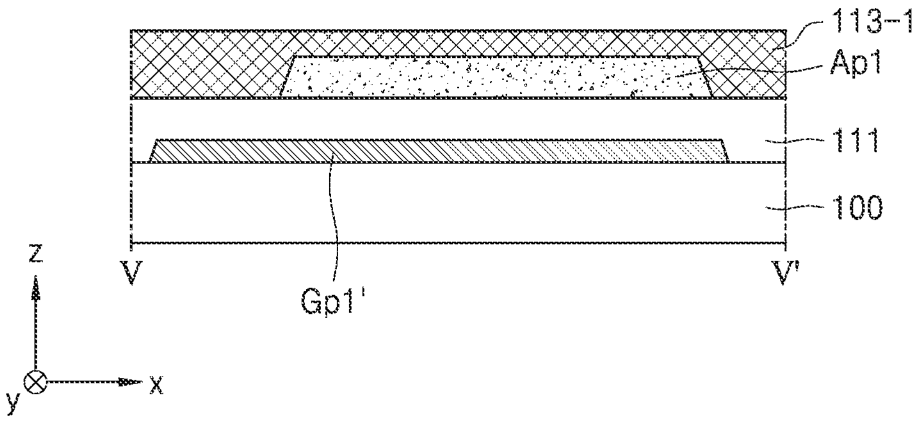
Figure 13C:
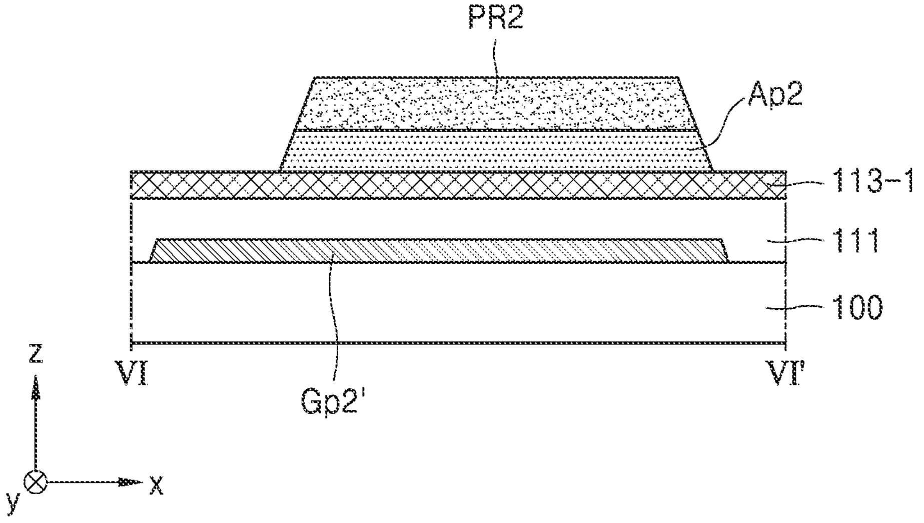

Referring to FIGS. 13A to 13C, the second semiconductor material layer SM2 may be etched by a second etching process. In the second etching process, the second semiconductor material layer SM2 is etched using the second photoresist layer PR2 as a mask. The second etching process may be a wet etching process using etchant. By the second etching process, the driving semiconductor layer A1 of the driving thin-film transistor T1, the switching semiconductor layer A2 of the switching thin-film transistor T2, and the second peripheral semiconductor layer Ap2 of the second peripheral thin-film transistor Tp2 may be formed.

Figure 14A:
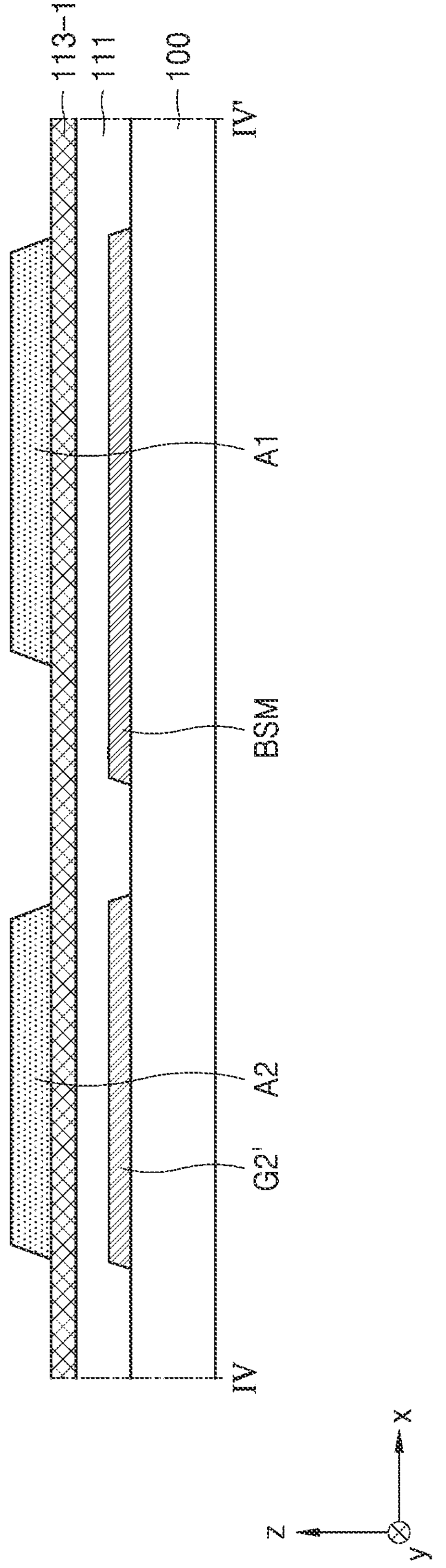
Figure 14B:
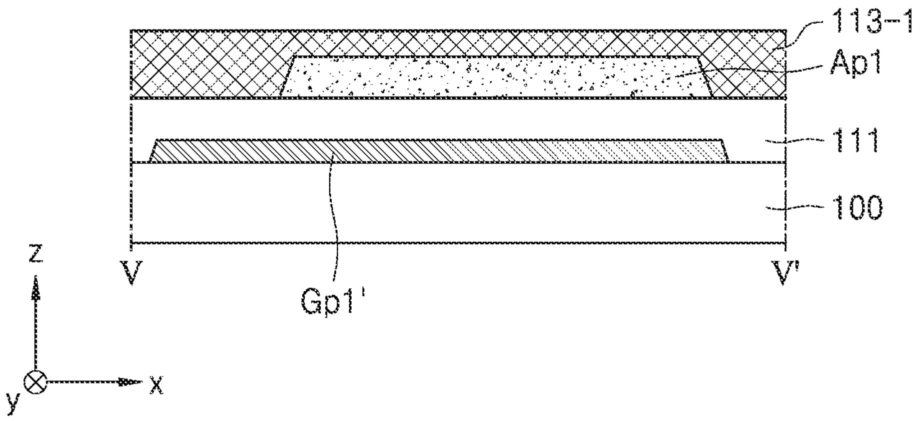
Figure 14C:
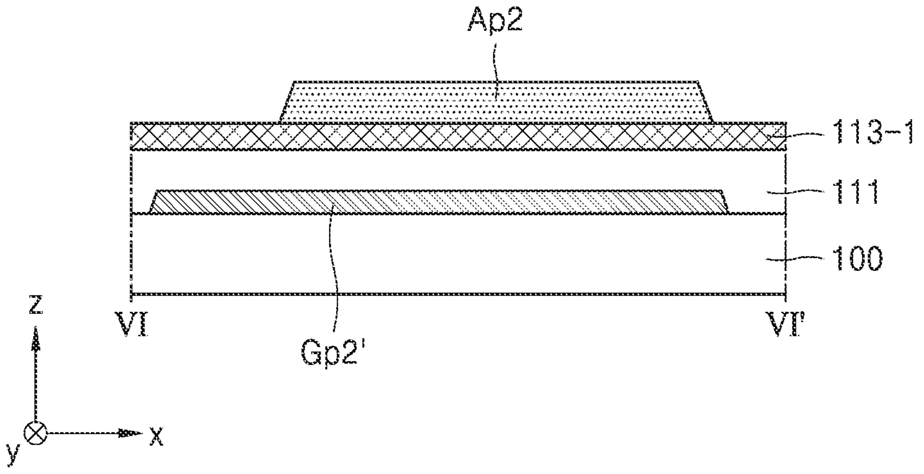

Referring to FIGS. 14A to 14C, the second photoresist layer PR2, e.g., see FIGS. 13A to 13C, remaining after the second etching process may be removed.

Figure 15A:
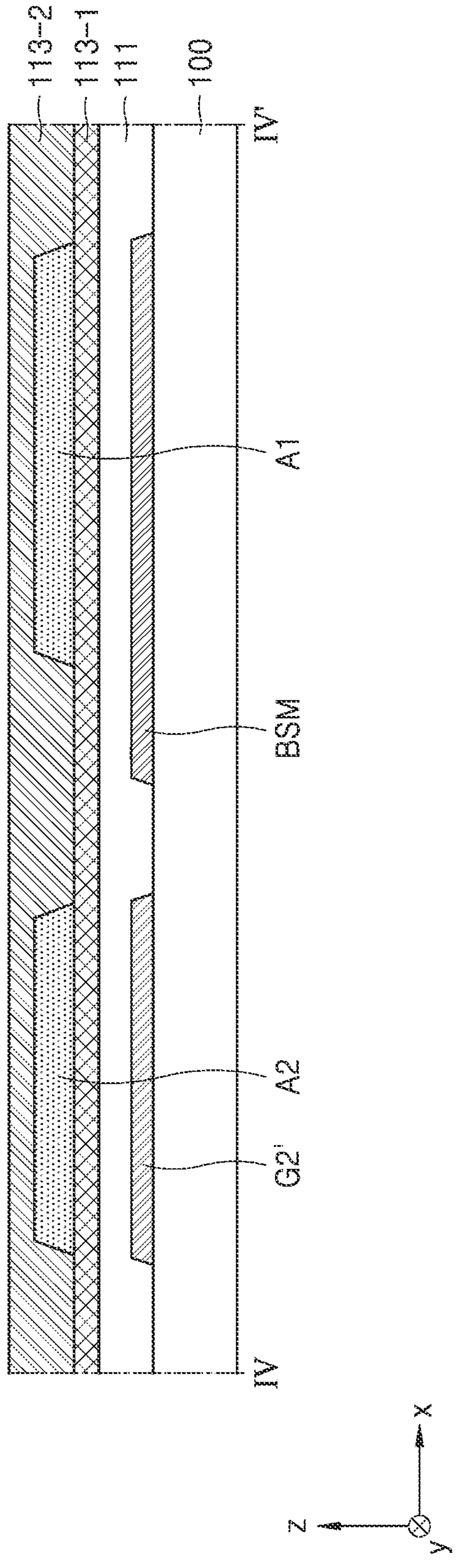
Figure 15B:
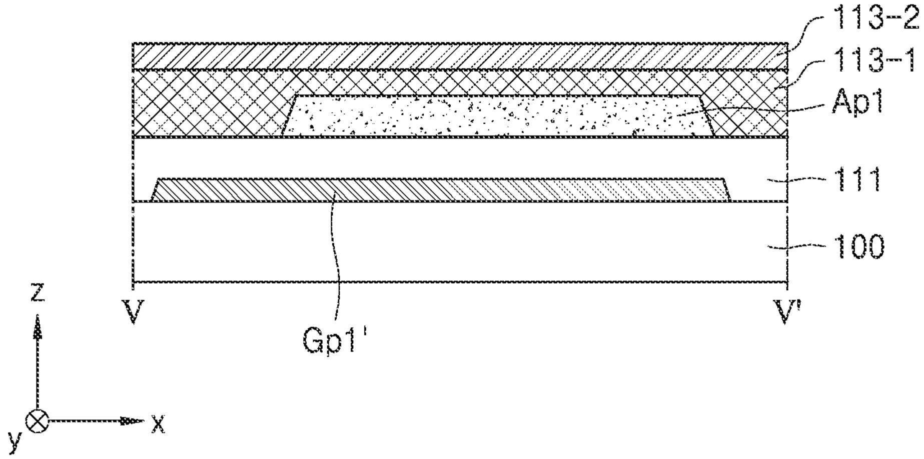
Figure 15C:
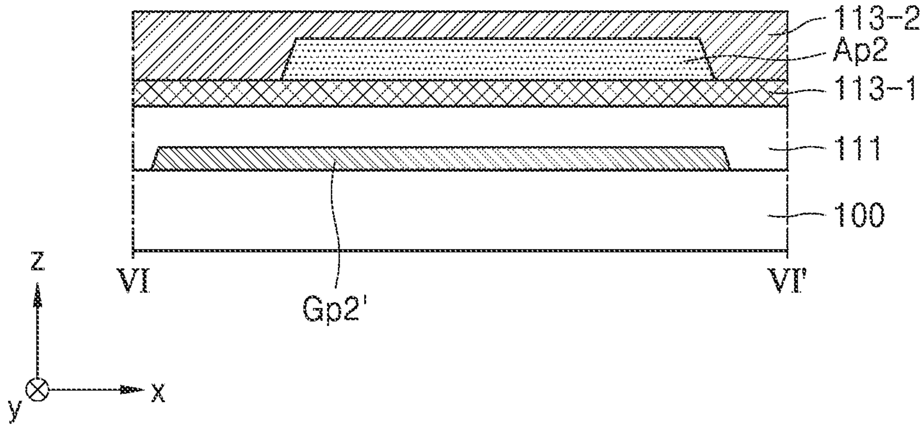

Referring to FIGS. 15A to 15C, the second gate insulating layer 113-2 may be formed on the first gate insulating layer 113-1. The second gate insulating layer 113-2 may cover the first gate insulating layer 113-1, the driving semiconductor layer A1, the switching semiconductor layer A2, and the second peripheral semiconductor layer Ap2.

Figure 16A:
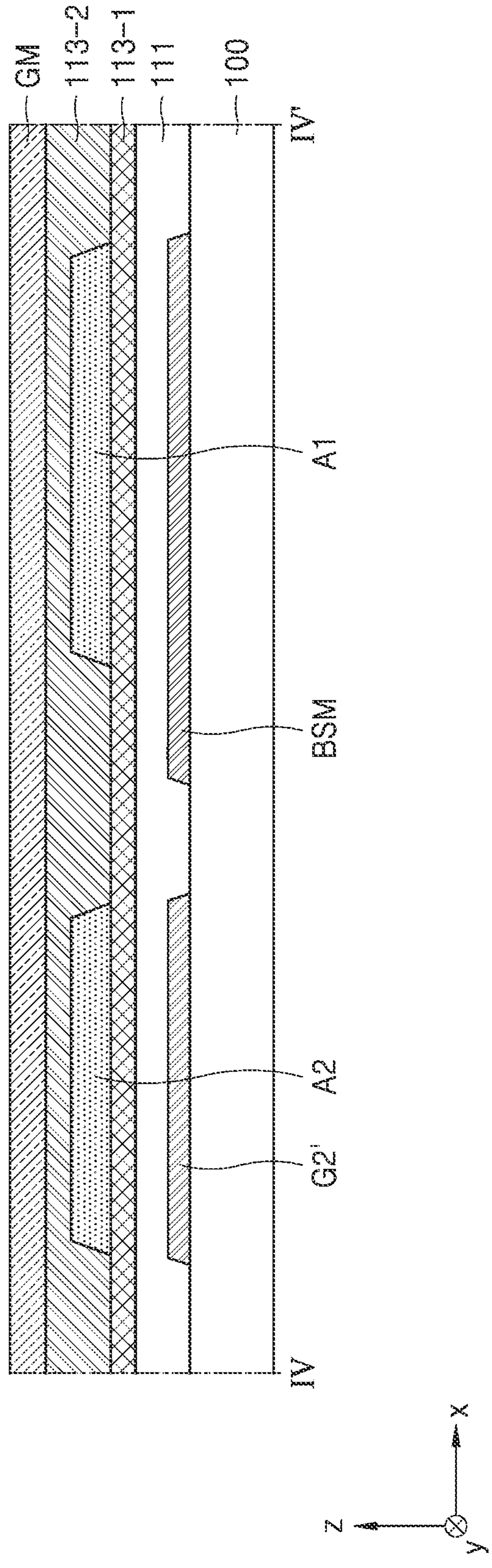
Figure 16B:
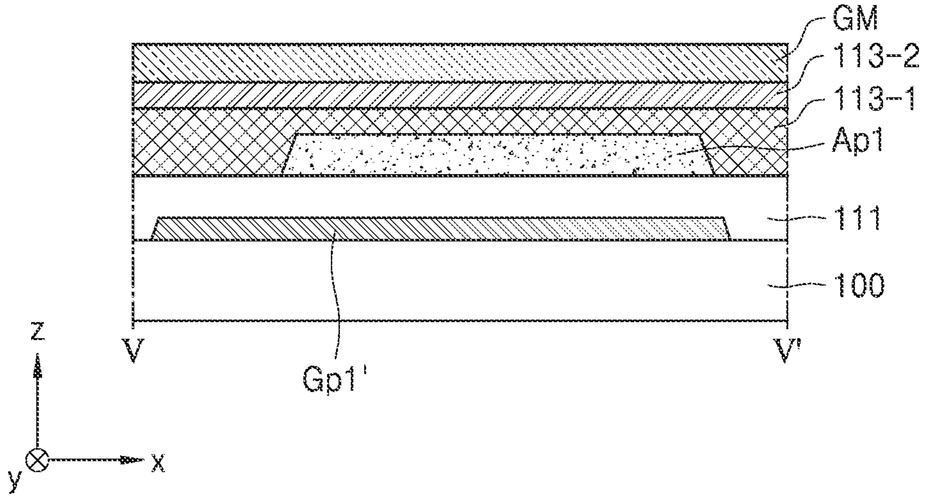
Figure 16C:
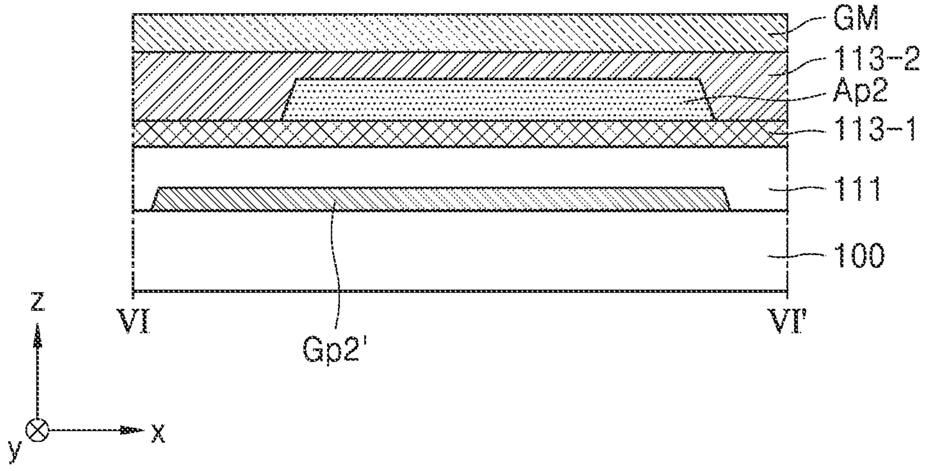

Referring to FIGS. 16A to 16C, a gate material layer GM may be formed on the second gate insulating layer 113-2. The gate material layer GM may cover the second gate insulating layer 113-2. The gate material layer GM may include a metal material.

Figure 17A:
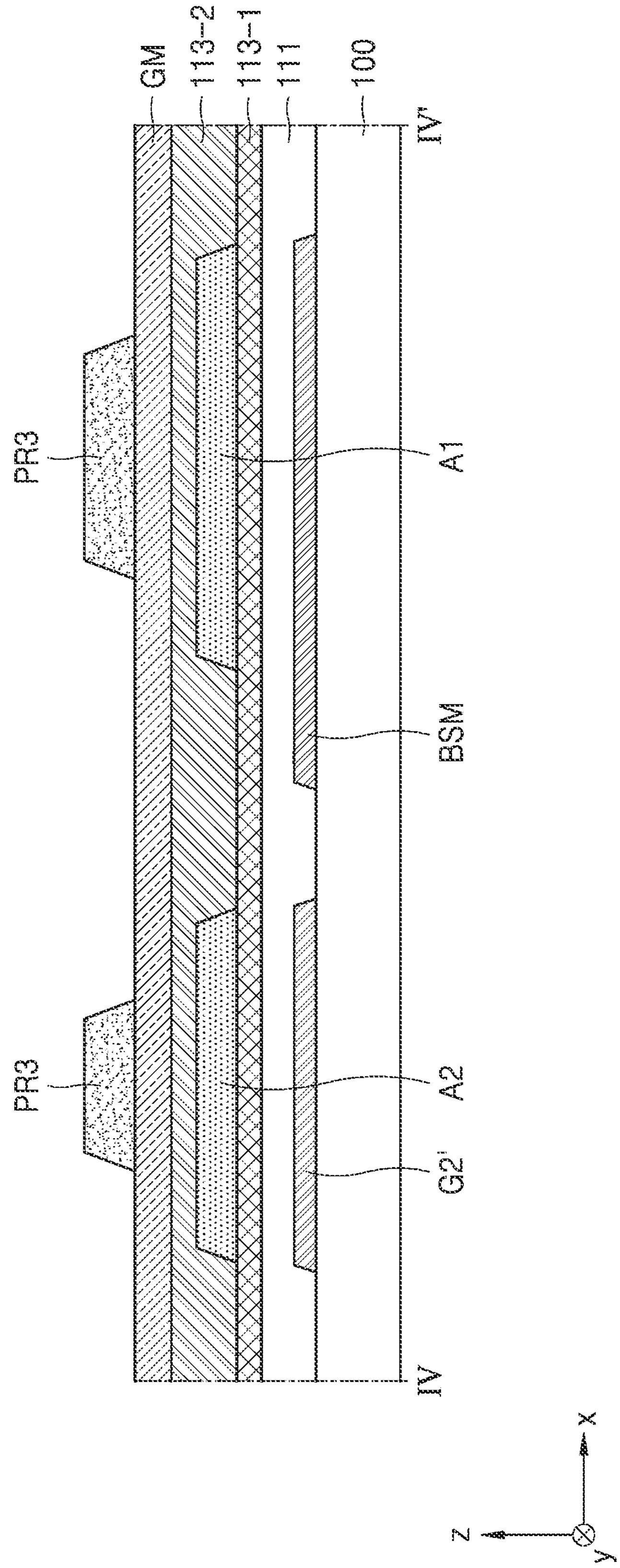
Figure 17B:
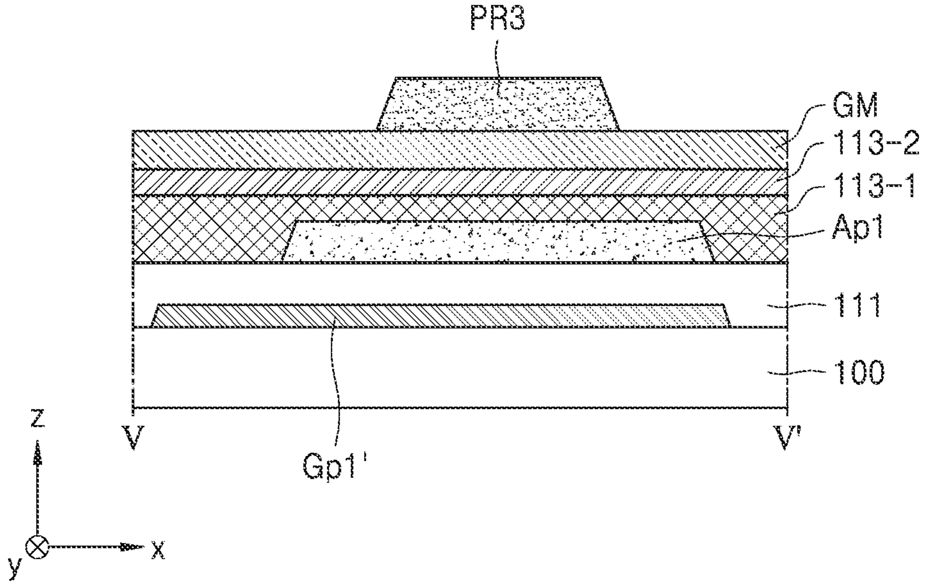
Figure 17C:
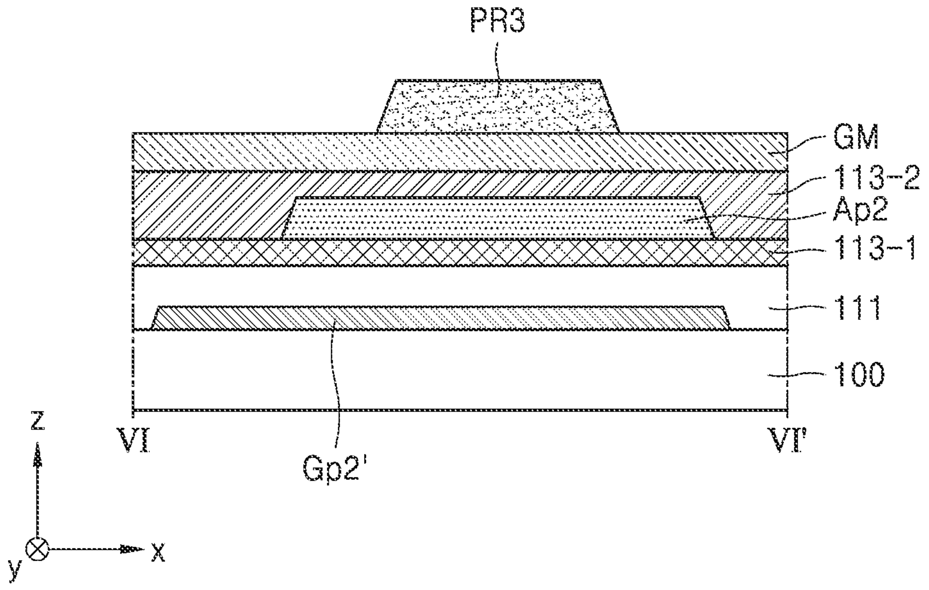

Referring to FIGS. 17A to 17C, a third photoresist PR3 may be formed on the gate material layer GM. The third photoresist layer PR3 may be disposed in a region in which the driving thin-film transistor T1, the switching thin-film transistor T2, the first peripheral thin-film transistor Tp1, and the second peripheral thin-film transistor Tp2 are to be formed.

Figure 18A:
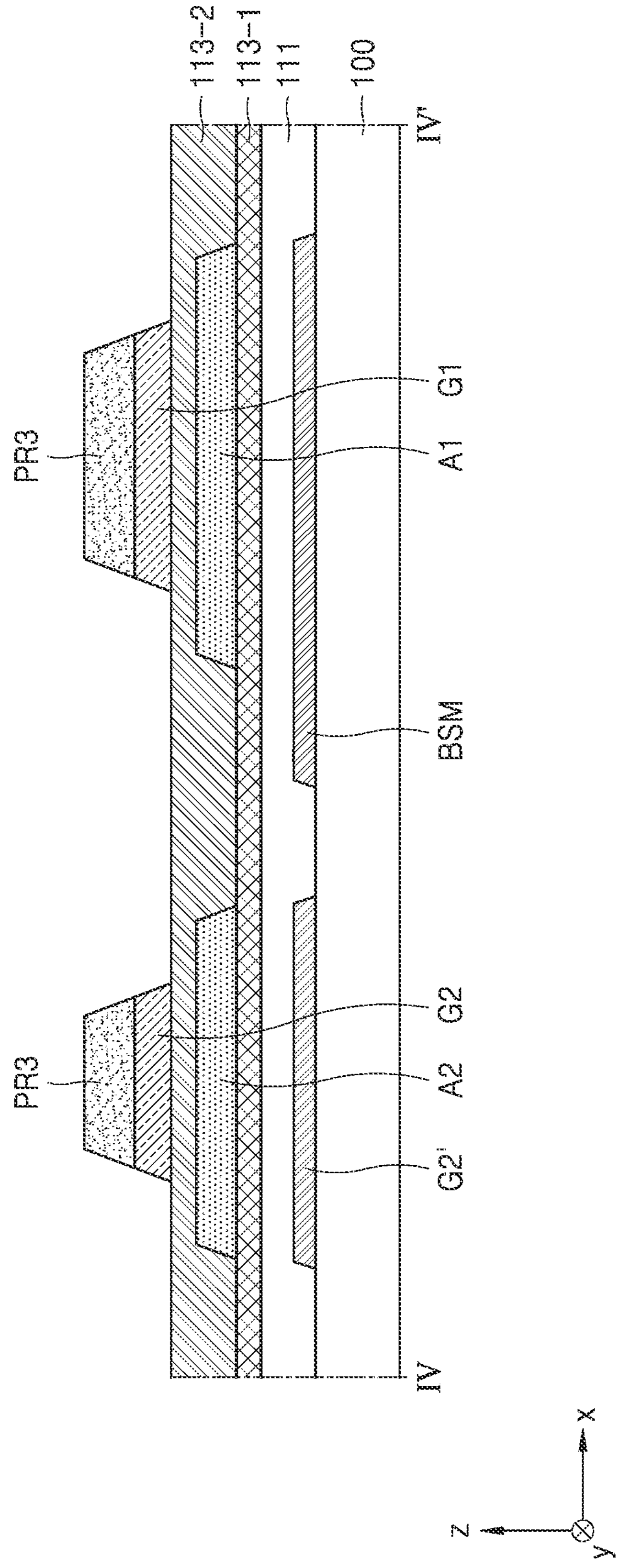
Figure 18B:
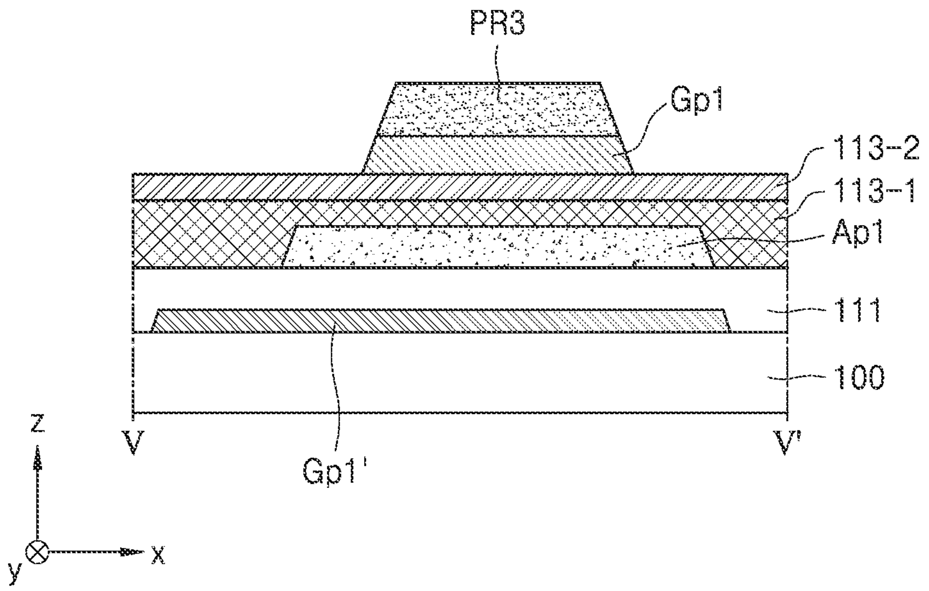
Figure 18C:
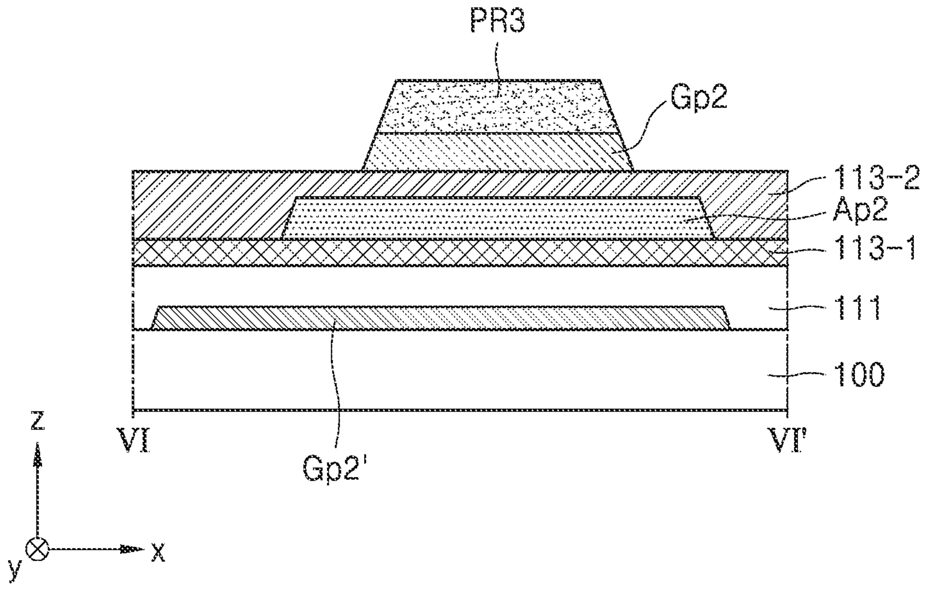

Referring to FIGS. 18A to 18C, the gate material layer GM may be etched by a third etching process. In the third etching process, the gate material layer GM is etched using the third photoresist layer PR3 as a mask. The third etching process may be a wet etching process using etchant. By the third etching process, the driving gate electrode G1 of the driving thin-film transistor T1, the switching gate electrode G2 of the switching thin-film transistor T2, the first peripheral gate electrode Gp1 of the first peripheral thin-film transistor Tp1, and the second peripheral gate electrode Gp2 of the second peripheral thin-film transistor Tp2 may be formed.

Figure 19A:
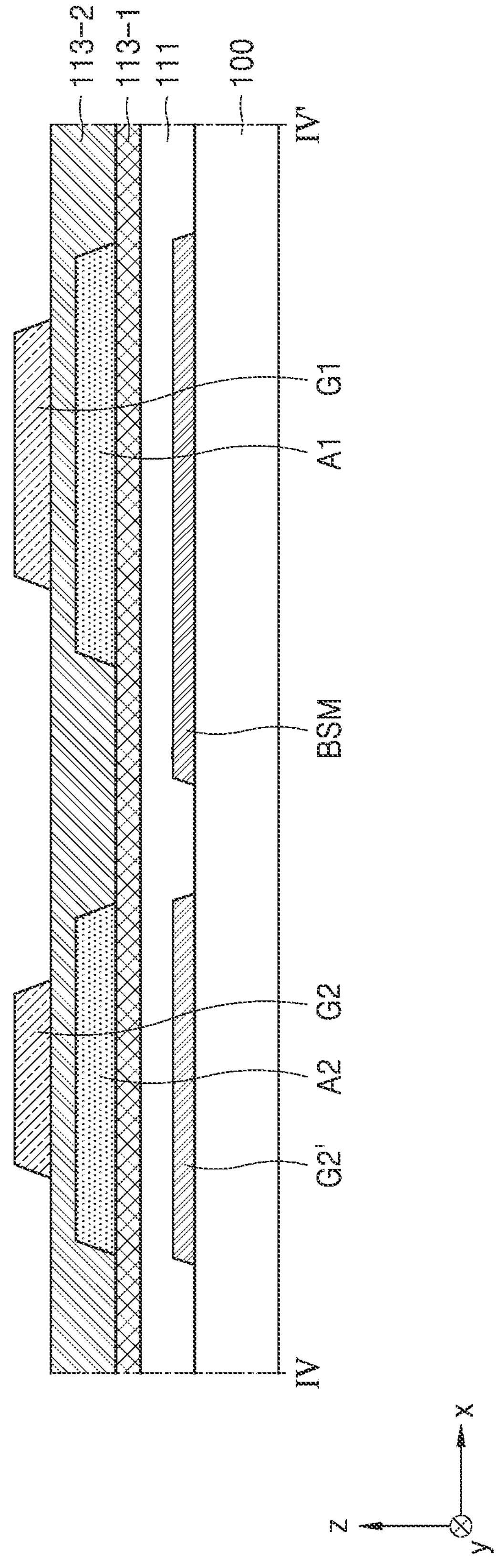
Figure 19B:
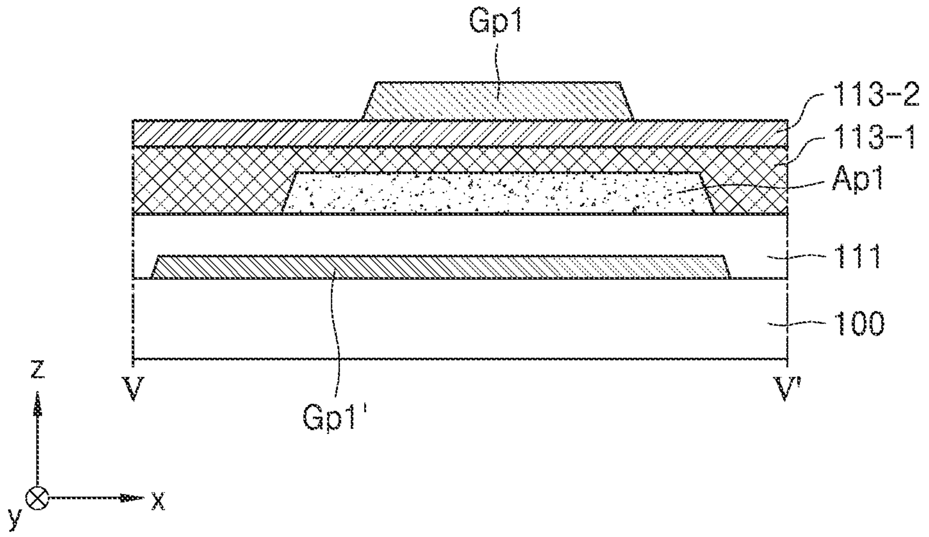
Figure 19C:
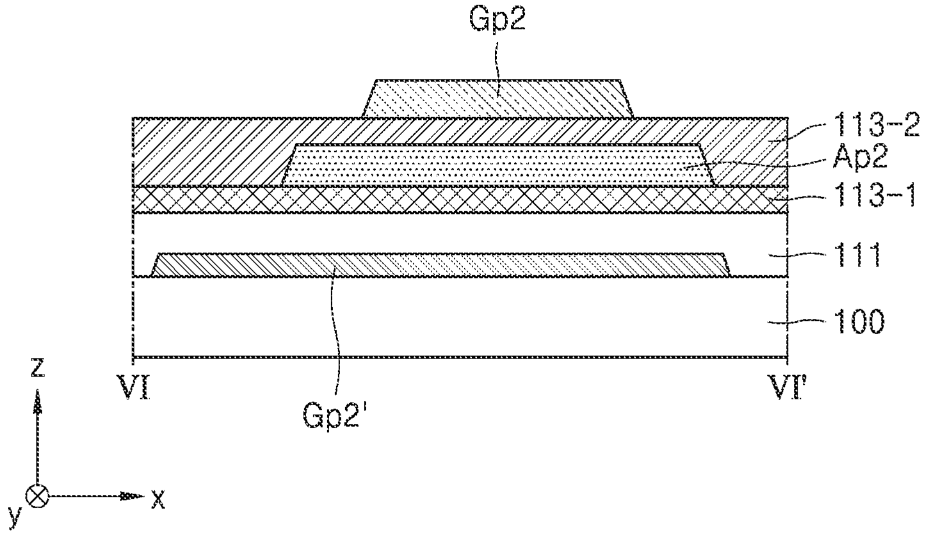

Referring to FIGS. 19A to 19C, the third photoresist layer PR3, e.g., see FIGS. 18A to 18C, remaining after the third etching process may be removed.

Figure 20A:
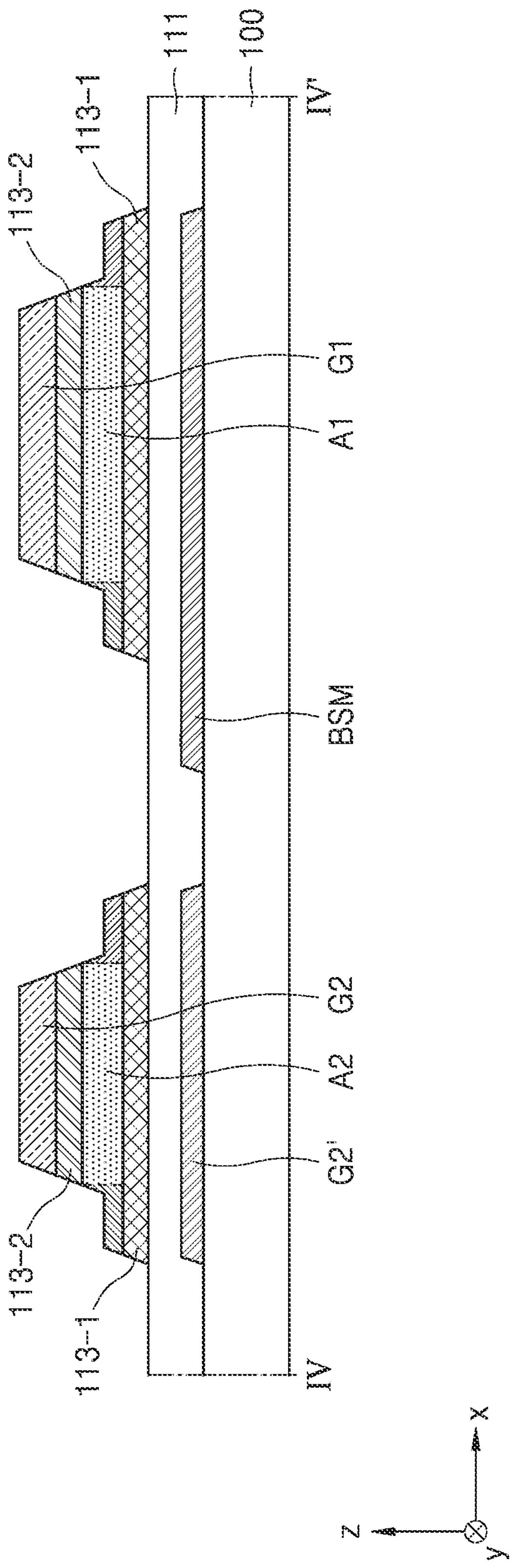
Figure 20B:
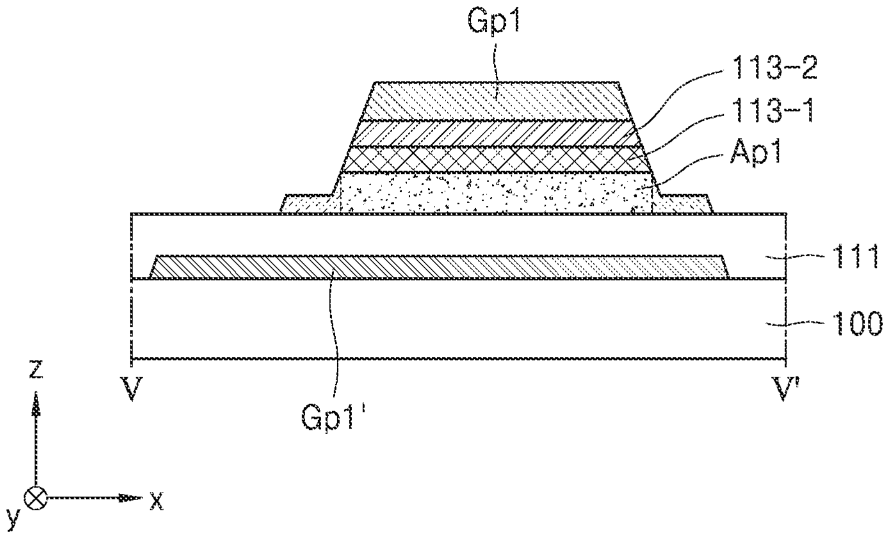
Figure 20C:
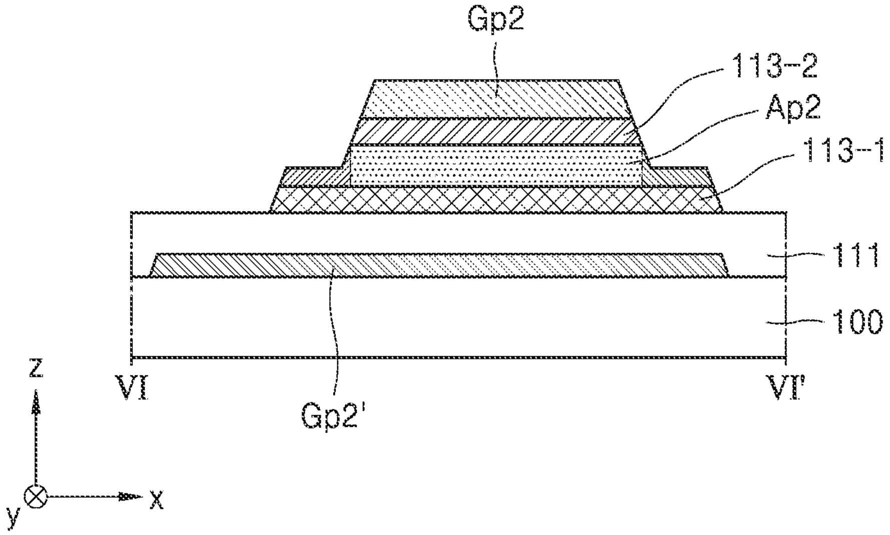

Referring to FIGS. 20A to 20C, the first gate insulating layer 113-1 and the second gate insulating layer 113-2 may be etched by a fourth etching process. In the fourth etching process, the first gate insulating layer 113-1 and the second gate insulating layer 113-2 are etched using the driving gate electrode G1, the switching gate electrode G2, the first peripheral gate electrode Gp1, and the second peripheral gate electrode Gp2 as masks. The fourth etching process may be a dry etching process using dry etch gas. Due to the fourth etching process, the first gate insulating layer 113-1 and the second gate insulating layer 113-2 are patterned, and the buffer layer 111 may be exposed. Because the first gate insulating layer 113-1 and the second gate insulating layer 113-2 are etched together by the fourth etching process, the manufacturing process may be simplified and the manufacturing time may be reduced.

In the fourth etching process, a thickness of the channel region of the driving semiconductor layer A1 overlapping the driving gate electrode G1 may be thicker than the thicknesses of a source region and a drain region thereof. A thickness of the channel region of the switching semiconductor layer A2 overlapping the switching gate electrode G2 may be thicker than the thicknesses of a source region and a drain region thereof. A thickness of the channel region of the first peripheral semiconductor layer Ap1 overlapping the first peripheral gate electrode Gp1 may be thicker than the thicknesses of a source region and a drain region thereof. A thickness of the channel region of the second peripheral semiconductor layer Ap2 overlapping the second peripheral gate electrode Gp2 may be thicker than the thicknesses of a source region and a drain region thereof.

Figure 21A:
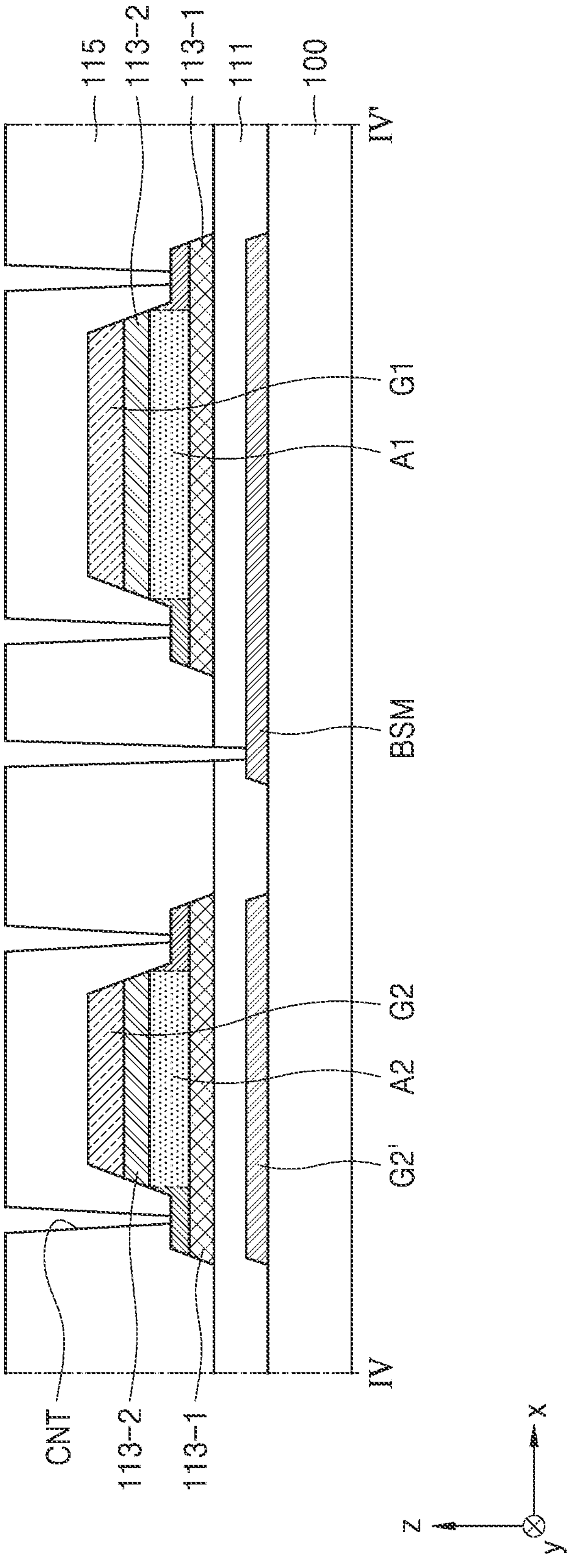
Figure 21B:
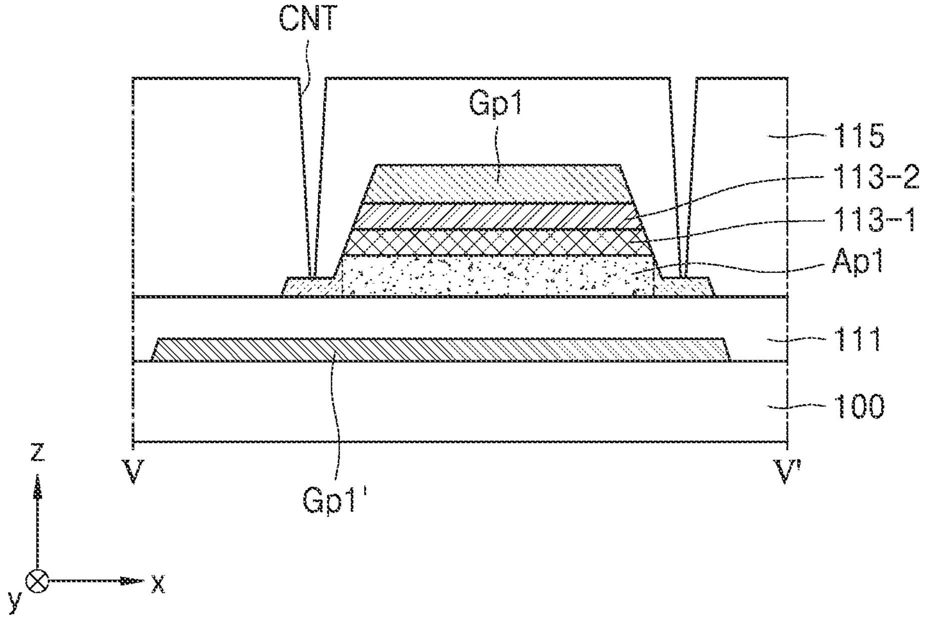
Figure 21C:
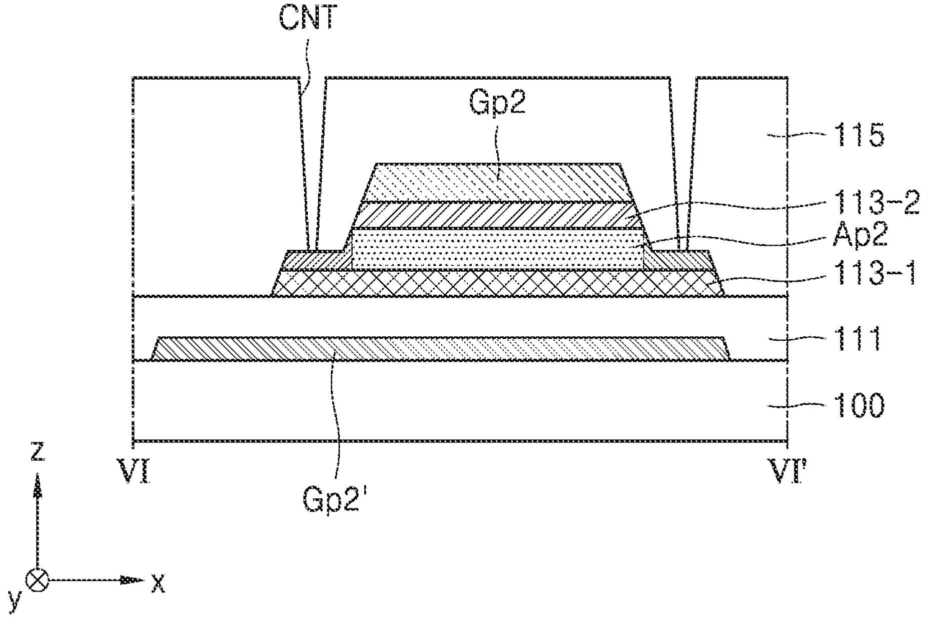

Referring to FIGS. 21A to 21C, the interlayer insulating layer 115 may be disposed on the substrate 100. The interlayer insulating layer 115 may be disposed on the buffer layer 111 to cover the first gate insulating layer 113-1, the second gate insulating layer 113-2, the driving semiconductor layer A1, the switching semiconductor layer A2, the first peripheral semiconductor layer Ap1, the second peripheral semiconductor layer Ap2, the driving gate electrode G1, the switching gate electrode G2, the first peripheral gate electrode Gp1, and the second peripheral gate electrode Gp2.

While the interlayer insulating layer 115 is formed, a heat treatment process is performed. In this case, hydrogen included in the interlayer insulating layer 115 may diffuse into the switching semiconductor layer A2, the driving semiconductor layer A1, the first peripheral semiconductor layer Ap1, and the second peripheral semiconductor layer Ap2. A portion of the switching semiconductor layer A2 into which hydrogen from the interlayer insulating layer 115 diffuses has a higher carrier concentration due to the diffused hydrogen to have properties of a conductor, and thus, may become a switching source region and a switching drain region. A portion of the driving semiconductor layer A1 into which hydrogen from the interlayer insulating layer 115 diffuses has a higher carrier concentration due to the diffused hydrogen to have properties of a conductor, and thus, may become a driving source region and a driving drain region. A portion of the first peripheral semiconductor layer Ap1 into which hydrogen from the interlayer insulating layer 115 diffuses has a higher carrier concentration due to the diffused hydrogen to have properties of a conductor, and thus, may become a first peripheral source region and a first peripheral drain region. A portion of the second peripheral semiconductor layer Ap2 into which hydrogen from the interlayer insulating layer 115 diffuses has a higher carrier concentration due to the diffused hydrogen to have properties of a conductor, and thus, may become a second peripheral source region and a second peripheral drain region.

Next, a contact hole CNT may be formed in the interlayer insulating layer 115 through a mask process.

Figure 22A:
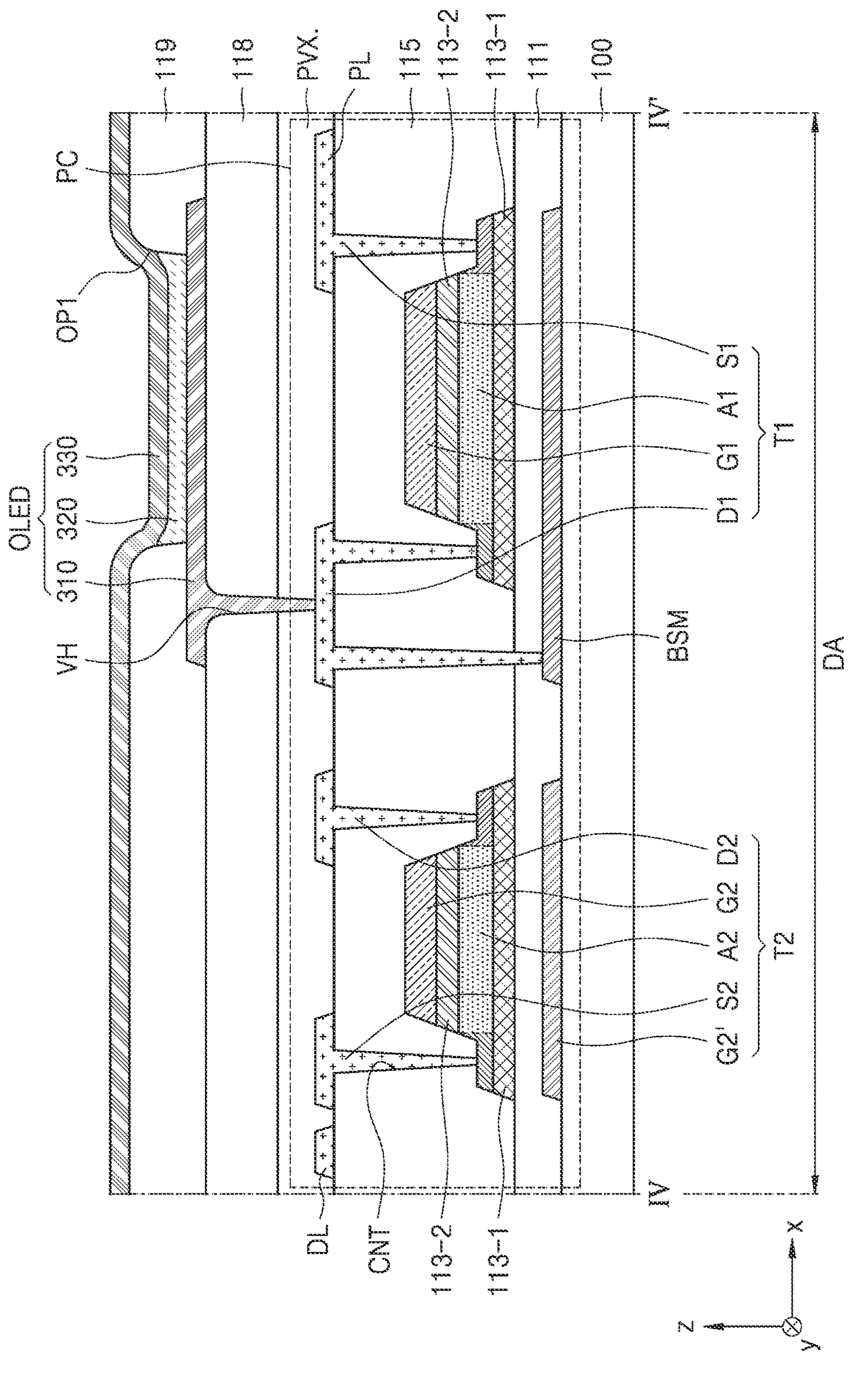
Figure 22B:
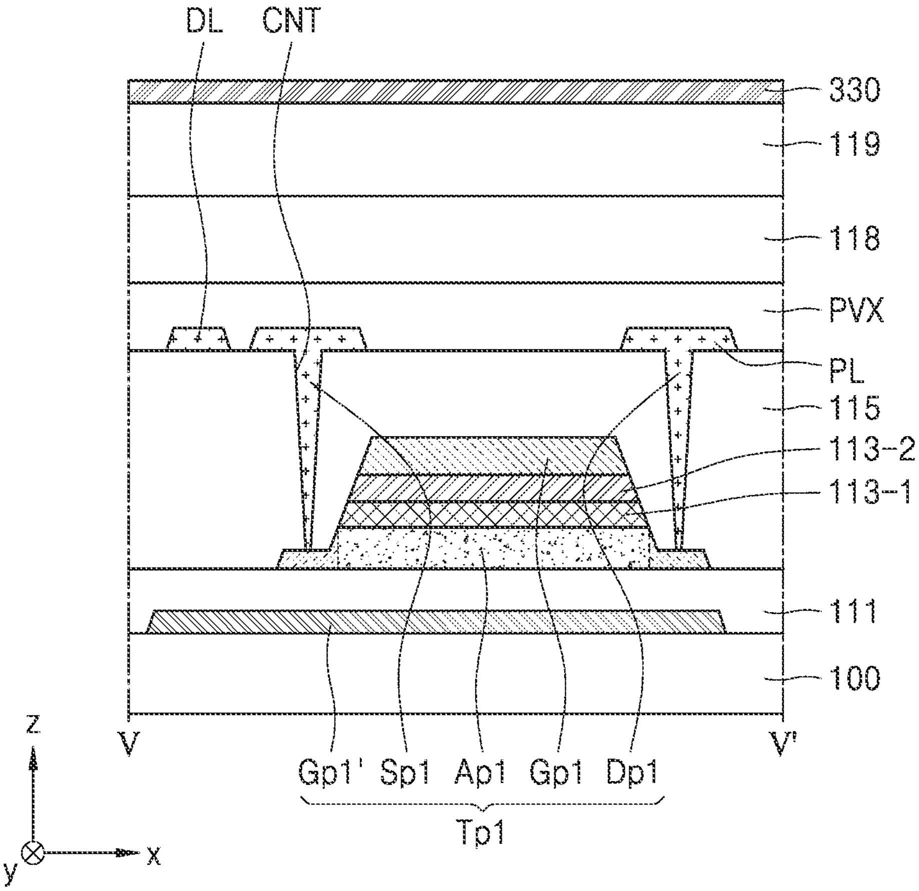
Figure 22C:
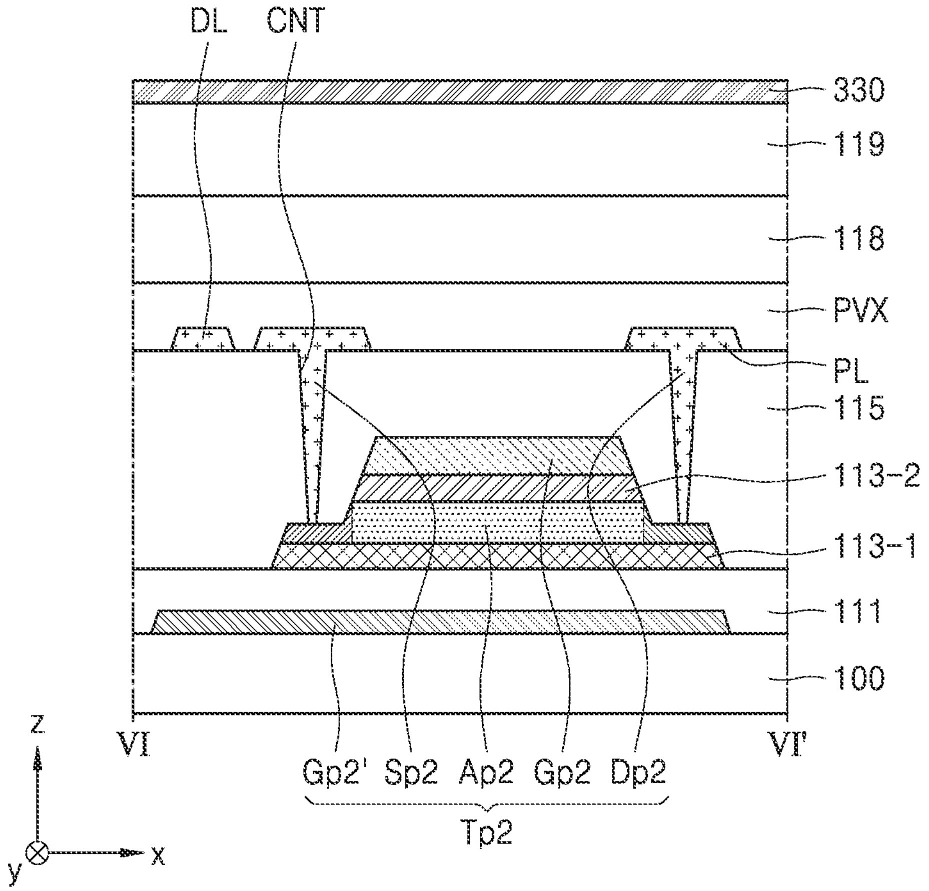

Referring to FIGS. 22A to 22C, the driving source electrode S1, the driving drain electrode D1, the switching source electrode S2, the switching drain electrode D2, the first peripheral source electrode Sp1, the first peripheral drain electrode Dp1, the second peripheral source electrode Sp2, and the second peripheral drain electrode Dp2, the data line DL, and the driving voltage line PL may be disposed on the interlayer insulating layer 115. In addition, the protective layer PVX may be disposed on the interlayer insulating layer 115 to cover the driving source electrode S1, the driving drain electrode D1, the switching source electrode S2, the switching drain electrode D2, the first peripheral source electrode Sp1, the first peripheral drain electrode Dp1, the second peripheral source electrode Sp2, and the second peripheral drain electrode Dp2, the data line DL, and the driving voltage line PL. The planarization layer 118, the pixel-defining layer 119, and the organic light-emitting diode OLED may be disposed on the protective layer PVX.

According to an embodiment, because the number of contact holes connecting the driving semiconductor layer and the switching semiconductor layer to each other is reduced, the occurrence of smear in the display apparatus may be reduced.

According to an embodiment, because the driving semiconductor layer and the switching semiconductor layer include a material having a relatively low mobility, the thickness of the driving semiconductor layer and the switching semiconductor layer may be easily adjusted.

According to an embodiment, because a distance between a semiconductor layer and a gate electrode disposed in a pixel circuit is relatively reduced, deterioration of the display apparatus may be reduced.

Effects of the disclosure are not limited to the above mentioned effects and other effects not mentioned may be clearly understood by those of ordinary skill in the art from the following claims.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:

a substrate including a display area and a peripheral area outside the display area;

a pixel circuit disposed in the display area and including a driving thin-film transistor and a switching thin-film transistor, wherein the driving thin-film transistor includes a driving semiconductor layer, and the switching thin-film transistor includes a switching semiconductor layer;

a display element connected to the pixel circuit; and a built-in driving circuit portion disposed in the peripheral area and including a first peripheral thin-film transistor including a first peripheral semiconductor layer, wherein the driving semiconductor layer and the switching semiconductor layer include a same material and each have a mobility less than a mobility of the first peripheral semiconductor layer and wherein the driving semiconductor layer and the switching semiconductor layer are each thicker than the first peripheral semiconductor layer.

2. The display apparatus of claim 1, wherein a thickness of the driving semiconductor layer and a thickness of the switching semiconductor layer are the same.

3. The display apparatus of claim 1, further comprising a first gate insulating layer disposed under the driving semiconductor layer and the switching semiconductor layer and disposed on the first peripheral semiconductor layer.

4. The display apparatus of claim 3, further comprising a second gate insulating layer disposed on the driving semiconductor layer and the switching semiconductor layer in the display area and disposed on the first gate insulating layer in the peripheral area.

5. The display apparatus of claim 1, wherein the built-in driving circuit portion includes a second peripheral thin-film transistor including a second peripheral semiconductor layer, and the second peripheral semiconductor layer includes a same material as a material of the driving semiconductor layer and the switching semiconductor layer.

6. The display apparatus of claim 5, wherein a thickness of the second peripheral semiconductor layer is the same as a thickness of the driving semiconductor layer and the switching semiconductor layer.

7. The display apparatus of claim 1, wherein each of the driving semiconductor layer and the switching semiconductor layer includes indium-gallium-zinc-oxide (InGaZn).

8. The display apparatus of claim 1, wherein the first peripheral semiconductor layer includes indium-tin-gallium-zinc-oxide (InSnGaZnO).

9. The display apparatus of claim 1, further comprising a bias electrode disposed on the substrate to correspond to the driving thin-film transistor.

* * * * *